(12) United States Patent
Lim et al.

(10) Patent No.: US 10,078,448 B2
(45) Date of Patent: Sep. 18, 2018

(54) ELECTRONIC DEVICES AND MEMORY MANAGEMENT METHODS THEREOF

(71) Applicant: Samsung Electronics Co., Ltd., Suwon-si, Gyeonggi-do (KR)

(72) Inventors: Sun-Young Lim, Hwasong-si (KR); Taeksoo Kim, Suwon-si (KR); Indong Kim, Seongnam-si (KR); Hangu Sohn, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 126 days.

(21) Appl. No.: 15/196,726

(22) Filed: Jun. 29, 2016

(65) Prior Publication Data
US 2017/0010817 A1    Jan. 12, 2017

(30) Foreign Application Priority Data

Jul. 8, 2015 (KR) .................. 10-2015-0097296
Jul. 8, 2015 (KR) .................. 10-2015-0097297

(51) Int. Cl.
*G06F 12/00* (2006.01)
*G06F 13/00* (2006.01)
(Continued)

(52) U.S. Cl.
CPC ............ *G06F 3/0604* (2013.01); *G06F 3/064* (2013.01); *G06F 3/065* (2013.01); *G06F 3/0619* (2013.01);
(Continued)

(58) Field of Classification Search
CPC ............ G06F 3/00; G06F 3/06–3/0602; G06F 3/0604–3/0619; G06F 3/062–3/064; G06F 3/0641–3/065; G06F 3/0652–3/0679; G06F 3/068–3/0689; G06F 12/00–12/16;
(Continued)

(56) References Cited

U.S. PATENT DOCUMENTS 5,511,195 A    4/1996  Kennedy, Jr. et al.
6,392,950 B2 *  5/2002  Ayukawa .............. G11O 5/04
                                              365/189.04
(Continued)

FOREIGN PATENT DOCUMENTS

JP    2012-079347    4/2012
KR    1020060120501  11/2006
WO    WO 2009/130848 10/2009

OTHER PUBLICATIONS

HiNFS: A Persistent Memory File System with Both Buffering and Direct-Access; Chen et al.; ACM Transactions on Storage—Special Issue on NVM and Storage, vol. 14, iss. 1; Article No. 4; Apr. 2018 (Year: 2018).*
(Continued)

*Primary Examiner* — Daniel C Chappell
(74) *Attorney, Agent, or Firm* — Myers Bigel, P.A.

(57) ABSTRACT

Electronic devices and memory management methods thereof are provided. Memory management methods may include setting page data of a nonvolatile memory as a read/write mode, copying the page data of the nonvolatile memory to a dynamic random access memory (DRAM) and setting the page data of the DRAM copied from the nonvolatile memory as a read only mode.

14 Claims, 21 Drawing Sheets

(51) Int. Cl.
*G06F 13/28* (2006.01)
*G06F 3/06* (2006.01)
*G11C 14/00* (2006.01)
*G11C 11/00* (2006.01)

(52) U.S. Cl.
CPC .......... *G06F 3/0659* (2013.01); *G06F 3/0665* (2013.01); *G06F 3/0679* (2013.01); *G11C 14/0018* (2013.01); *G11C 14/0063* (2013.01); *G11C 11/005* (2013.01)

(58) Field of Classification Search
CPC .......... G06F 17/30–17/30997; G06F 2003/0691–2003/0698; G06F 2212/00–2212/7211; G11C 11/00; G11C 11/005–11/02; G11C 11/21–11/44; G11C 11/56–11/5692; G11C 14/00–14/0018; G11C 14/0027–14/0063; G11C 14/0072–14/009; G11C 16/06–16/3495; G11C 99/00; G11C 2211/00–2211/565; G11C 2216/00–2216/30
See application file for complete search history.

(56) References Cited

U.S. PATENT DOCUMENTS

| | | | |
|---|---|---|---|
| 7,644,239 B2* | 1/2010 | Ergan | G06F 3/061 |
| | | | 711/154 |
| 7,679,133 B2 | 3/2010 | Son et al. | |
| 8,032,698 B2* | 10/2011 | Nam | G06F 12/0866 |
| | | | 711/103 |
| 8,156,288 B2 | 4/2012 | Karamcheti et al. | |
| 8,296,496 B2 | 10/2012 | Mogul et al. | |
| 8,370,533 B2 | 2/2013 | Koka et al. | |
| 8,423,700 B2 | 4/2013 | Panabaker et al. | |
| 8,553,466 B2 | 10/2013 | Han et al. | |
| 8,559,235 B2 | 10/2013 | Yoon et al. | |
| 8,639,872 B1* | 1/2014 | Boyle | G06F 12/0871 |
| | | | 711/103 |
| 8,654,587 B2 | 2/2014 | Yoon et al. | |
| 8,694,857 B2 | 4/2014 | Wang et al. | |
| 8,713,357 B1 | 4/2014 | Jean et al. | |
| 8,738,840 B2 | 5/2014 | Tzeng | |
| 8,775,720 B1* | 7/2014 | Meyer | G06F 3/0659 |
| | | | 711/103 |
| 9,047,178 B2 | 6/2015 | Talagala et al. | |
| 9,652,180 B2* | 5/2017 | Park | G06F 3/0679 |
| 9,715,939 B2* | 7/2017 | Ellis | G11C 16/3459 |
| 9,720,621 B2* | 8/2017 | Furuya | G06F 3/065 |
| 9,798,499 B2* | 10/2017 | Bazzani | G06F 3/0685 |
| 9,870,165 B2* | 1/2018 | Palmer | G06F 3/0619 |
| 9,898,201 B2* | 2/2018 | Oikawa | G06F 3/061 |
| 9,952,784 B2* | 4/2018 | Sathyanarayan | G06F 3/0619 |
| 2002/0199056 A1* | 12/2002 | Ayukawa | G11C 11/005 |
| | | | 711/106 |
| 2006/0224820 A1* | 10/2006 | Cho | G11C 7/1039 |
| | | | 711/103 |
| 2006/0271755 A1 | 11/2006 | Miura | |
| 2008/0024899 A1* | 1/2008 | Chu | G06F 3/0614 |
| | | | 360/69 |
| 2008/0059694 A1* | 3/2008 | Lee | G06F 3/0625 |
| | | | 711/103 |
| 2008/0235468 A1* | 9/2008 | Chen | G06F 12/0246 |
| | | | 711/154 |
| 2009/0122610 A1* | 5/2009 | Danon | G11C 11/5628 |
| | | | 365/185.08 |
| 2009/0228739 A1* | 9/2009 | Cohen | G06F 11/1072 |
| | | | 714/6.12 |
| 2010/0146205 A1* | 6/2010 | Baum | G06F 12/0804 |
| | | | 711/113 |
| 2010/0241793 A1 | 9/2010 | Sugimoto et al. | |
| 2010/0329019 A1* | 12/2010 | Mukunoki | G11C 7/08 |
| | | | 365/185.18 |
| 2011/0233648 A1 | 9/2011 | Seol et al. | |
| 2013/0198453 A1* | 8/2013 | Kim | G06F 12/0871 |
| | | | 711/118 |
| 2014/0195480 A1 | 7/2014 | Talagala et al. | |
| 2014/0215119 A1* | 7/2014 | Fujii | G06F 3/06 |
| | | | 711/5 |
| 2014/0237168 A1 | 8/2014 | Prins et al. | |
| 2014/0281240 A1 | 9/2014 | Willhalm | |
| 2015/0003175 A1 | 1/2015 | Ramanujan | |
| 2015/0006834 A1 | 1/2015 | Dulloor et al. | |
| 2015/0032972 A1 | 1/2015 | Sakthivelu et al. | |
| 2016/0259726 A1* | 9/2016 | Ide | G06F 3/06 |

OTHER PUBLICATIONS

Hardware/software cooperative caching for hybrid DRAM/NVM memory architectures; Liu et al.; Proceedings of the International Conference on Supercomputing; Article No. 26; Jun. 14-16, 2017 (Year: 2017).*

H-ARC: A non-volatile memory based cache policy for solid state drives; Fan et al.; 30th Symposium on Mass Storage Systems and Technologies; Jun. 2-6, 2014 (Year: 2014).*

I/O-Cache: A Non-volatile Memory Based Buffer Cache Policy to Improve Storage Performance; Fan et al.; 23rd International Symposium on Modeling, Analysis and Simulation of Computer and Telecommunication Systems; Oct. 5-7, 2015; pp. 102-111 (Year: 2015).*

* cited by examiner

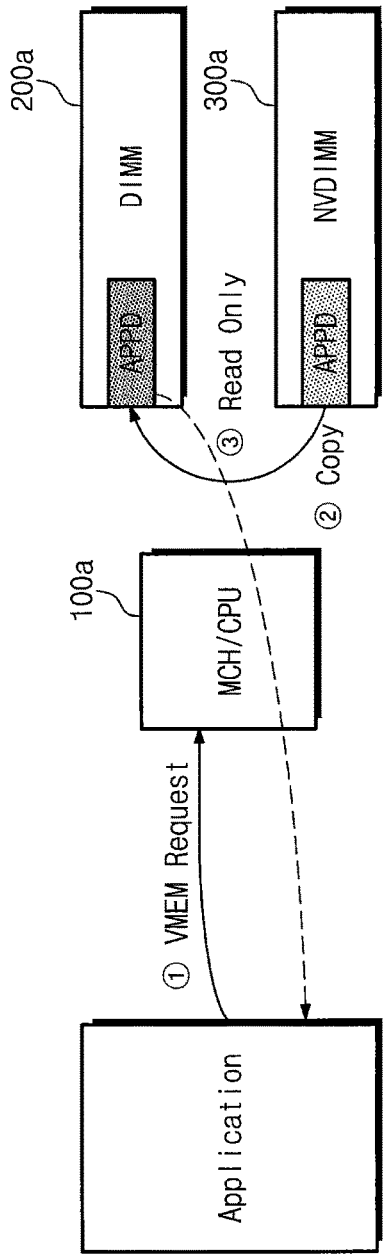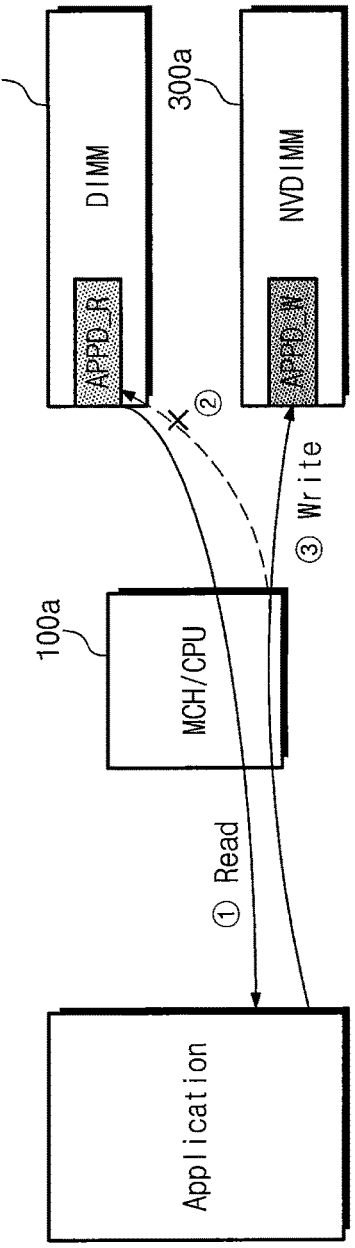

ELECTRONIC DEVICES AND MEMORY MANAGEMENT METHODS THEREOF

CROSS-REFERENCE TO RELATED APPLICATIONS

This U.S. non-provisional patent application claims priority under 35 U.S.C. § 119 to Korean Patent Application No. 10-2015-0097297 filed on Jul. 8, 2015 and Korean Patent Application No. 10-2015-0097296 filed on Jul. 8, 2015, in the Korean Intellectual Property Office, the disclosures of all of which are incorporated by reference herein in their entireties.

BACKGROUND

The present disclosure relates to an electronic device (e.g., a computing system) and a memory management method thereof.

A nonvolatile memory for various interfaces of a computing system is being researched and developed. For example, a flash memory may be designed for both data storage device and main memory (e.g., working memory) which may be inserted in the same slot of a computer system. In this case, the flash memory may need to be compatible with a conventional volatile random access memory (RAM) (e.g., a dynamic RAM (DRAM)), and thus a technique for maintaining compatibility with a volatile RAM and optimal data integrity may be necessary.

SUMMARY

A memory management method of a computing system may include setting page data of a nonvolatile memory as a read/write mode, copying the page data of the nonvolatile memory to a dynamic random access memory (DRAM) and setting the page data of the DRAM copied from the nonvolatile memory as a read only mode.

In various embodiments, the page data of the nonvolatile memory may include application data.

According to various embodiments, the computing system may include a processor that may be configured to set the page data of the nonvolatile memory as a read/write mode, configured to copy the page data of the nonvolatile memory to the DRAM and configured to set the page data of the DRAM copied from the nonvolatile memory as a read only mode. The computing system may also include a memory module that may be connected to the processor with a double data rate (DDR) interface and may include the DRAM and a nonvolatile memory module that may be connected to the processor with the DDR interface and may include the nonvolatile memory.

In various embodiments, the copying of the page data of the nonvolatile memory may include receiving a memory allocation request from a first application of the processor and copying the page data of the nonvolatile memory to the DRAM in response to the memory allocation request.

According to various embodiments, the method may further include receiving a read request from a second application of the processor and reading the page data of the DRAM in response to the read request.

In various embodiments, the method may further include receiving a write request from a third application of the processor and writing data in the nonvolatile memory in response to the write request.

According to various embodiments, the writing of the data in the nonvolatile memory may include performing a write operation on the DRAM in response to the write request, receiving write failure information from the DRAM and writing the data in the nonvolatile memory in response to the write failure information.

In various embodiments, the writing of the data in the nonvolatile memory may include setting an address of a static random access memory (SRAM) included in the nonvolatile memory, writing the data in the SRAM and setting the data in the SRAM as the read/write mode.

According to various embodiments, the page data of the DRAM is one among a plurality of page data stored in the DRAM. The method may further include receiving an update request about at least one of the plurality of page data stored in the DRAM from a fourth application of the processor and writing data that will be updated in the at least one of the plurality of page data in the DRAM to at least one page data in the nonvolatile memory in response to the update request.

In various embodiments, the method may also include, when a number of pieces of page data stored in the nonvolatile memory exceeds a reference value, copying at least one of the pieces of page data stored in the nonvolatile memory to the DRAM in a background operation According to various embodiments, the computing system may include a processor that may be configured to set the page data of the nonvolatile memory as a read/write mode, configured to copy the page data of the nonvolatile memory to the DRAM and configured to set the page data of the DRAM copied from the nonvolatile memory as a read only mode. The computing system may also include a nonvolatile memory module that may be connected to the processor through a DDR interface and may include the DRAM and the nonvolatile memory.

A computing system may include a processor, at least one memory module configured to communicate with the processor with a double data rate (DDR) interface and at least one nonvolatile memory module configured to communicate with the processor with the DDR interface. The processor may be configured to copy first application data of the at least one nonvolatile memory module to the at least one memory module in response to a memory allocation request of an application and configured to set the application data copied to the at least one memory module as a read only mode.

In various embodiments, the processor may be configured to read the first application data from the at least one memory module in response to a read request of the application, configured to write a second application data in a static random access memory (SRAM) of the at least one nonvolatile memory module in response to a write request of the application, and sets the second application data written in the SRAM as a read/write mode.

In various embodiments, the processor may include a memory management unit configured to manage page data of the at least one memory module using the read only mode and configured to manage page data of the at least one nonvolatile memory module using a read/write mode.

According to various embodiments, the at least one nonvolatile memory module may include a plurality of nonvolatile memories, a buffer memory configured to temporarily store data and a nonvolatile memory module controller configured to control the plurality of nonvolatile memories and the buffer memory. The nonvolatile memory module controller may include a RAM that may be configured to exchange data with the processor through the DDR interface.

According to various embodiments, the at least one nonvolatile memory module may include a plurality of nonvolatile memories, a plurality of dynamic random access memories (DRAMs) configured to input and output data from and to the processor and a nonvolatile memory module controller configured to control the plurality of DRAMs and the plurality of nonvolatile memories and configured to make the processor access the plurality of nonvolatile memories.

In various embodiments, the computing system may further include data buffers configured to perform buffering so as to input and output the data between the processor and the plurality of DRAMs.

A memory management method of a computing system which may include a processor, a memory module, and a nonvolatile memory module may include receiving a memory allocation request from an application, copying application data stored in the nonvolatile memory module to the memory module in response to the memory allocation request and setting the application data of the memory module copied from the nonvolatile memory module as a read only mode.

In various embodiments, the method may further include setting the application data stored in the nonvolatile memory module as a read/write mode.

According to various embodiments, the method may further include receiving a write request from the application, performing a write operation on the memory module in response to the write request and performing a write operation on the a static random access memory (SRAM) of the nonvolatile memory module after the write operation on the memory module fails.

A memory management method of an electronic device may include reading first application data from a memory module in response to a read request from a first application of a processor. The memory module may be connected to the processor with an interface and may be set as a read only mode. The method may also include writing second application data to a nonvolatile memory module in response to a write request from a second application of the processor. The nonvolatile memory module may be connected to the processor with the interface and may be set as a read/write mode.

According to various embodiments, the interface may include a double data rate (DDR) interface.

In various embodiments, writing the second application data to the nonvolatile memory module may include writing the second application data to a static random access memory (SRAM) in the nonvolatile memory module.

In various embodiments, writing the second application data to the nonvolatile memory module may include performing a write operation on the memory module and performing a write operation on the nonvolatile memory module after the write operation on the memory module fails.

According to various embodiments, writing the second application data to the nonvolatile memory module may include performing a write operation on the nonvolatile memory module without performing a write operation on the memory module.

According to various embodiments, the method may further include receiving a memory allocation request from a third application of the processor, copying third application data stored in the nonvolatile memory module to the memory module in response to the memory allocation request and setting the third application data in the memory module as a read only mode.

BRIEF DESCRIPTION OF THE DRAWINGS

The above and other objects and features will become apparent from the following description with reference to the following figures, wherein like reference numerals refer to like parts throughout the various figures unless otherwise specified.

FIG. 9 is a diagram illustrating a memory management method of a computing system according to some embodiments of the inventive concept.

FIG. 10 is a diagram illustrating a memory management method of a computing system according to some embodiments of the inventive concept.

DETAILED DESCRIPTION

Figure 1:
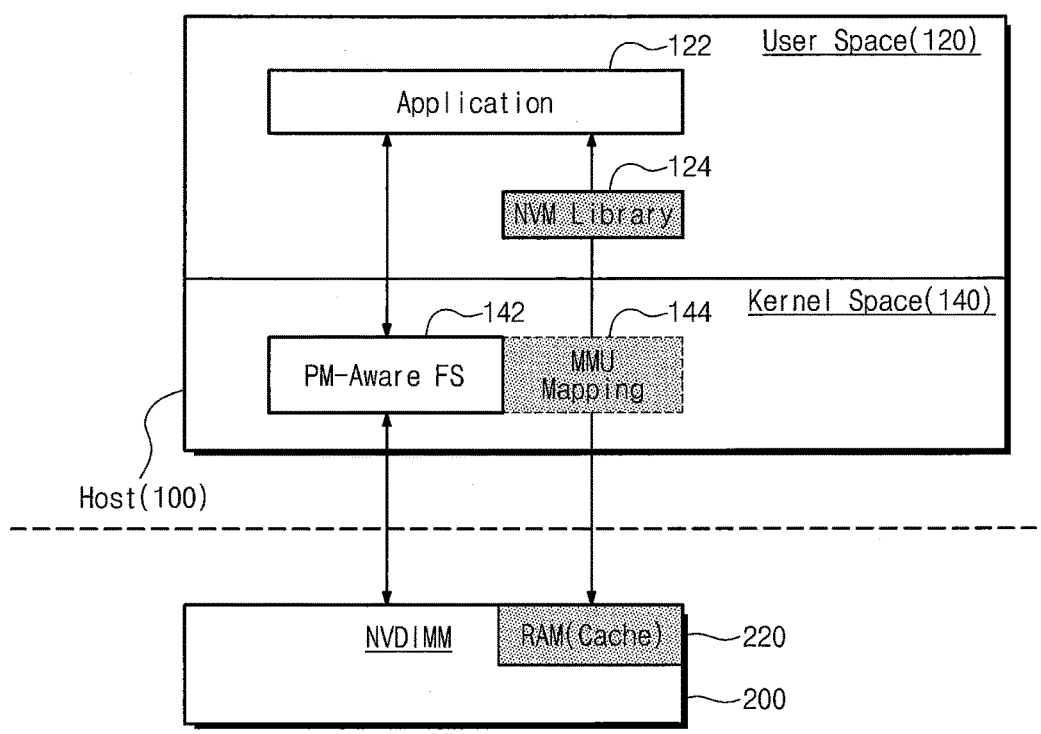
FIG. 1 is a block diagram illustrating a computing system 10 according to some embodiments of the inventive concept.

Hereinafter, electronic devices (e.g., computing system) according to some embodiments of the present inventive concept will be described with reference to the accompanying drawings.

Those of ordinary skill in the art will recognize that modification, equivalent, and/or alternative on the various embodiments described herein can be variously made without departing from the scope and spirit of the present disclosure. With regard to description of drawings, similar components may be marked by similar reference numerals. The terms, such as "first", "second", and the like used herein may refer to various elements of various embodiments of the present disclosure, but do not limit the elements.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes" and/or "including", when used in this specification, specify the presence of stated features, steps, operations, elements and/or components, but do not preclude the presence or addition of one or more other features, steps, operations, elements, components and/or groups thereof.

It will be understood that when an element is referred to as being "coupled," "connected," or "responsive" to or "on" another element, it can be directly coupled, connected, or responsive to or on the other element, or intervening elements may also be present. In contrast, when an element is referred to as being "directly coupled," "directly connected" or "directly responsive" to or "directly on" another element, there are no intervening elements present. As used herein the term "and/or" includes any and all combinations of one or more of the associated listed items.

It should also be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 is a block diagram illustrating an electronic device (e.g., computing system) 10 according to some embodiments of the inventive concept.

Referring to FIG. 1, a computing system 10 may include a host 100 and a nonvolatile memory module (NVDIMM) 200.

The host 100 may include a user space 120 and a kernel space 140.

Each of the components 120 and 140 illustrated in FIG. 1 may be implemented with software and/or hardware such as field-programmable gate array (FPGA) or application-specific integrated circuit (ASIC).

However, the components 120 and 140 may not be limited to the software or hardware and may also be implemented with a storage medium in which the addressing is possible to execute at least one operation of a processor.

The user space 120 may be an area where an application 122 is executed, and a kernel space 140 may be a reserved area for kernel execution.

A system call may be used to access the kernel space 140 from the user space 120. The kernel space 140 may include a permanent memory aware file system (PM-Aware FS) 142 and a memory management unit mapping table (MMU Mapping) 144. The application 122 may access (e.g., load, store, read, etc.) data of the nonvolatile memory module (NVDIMM) 200 using the permanent memory aware file system 142. Here, the application 122 may communicate with the permanent memory aware file system 142 through an application processor interface (API).

Furthermore, the application 122 may access a random access memory (RAM) 220 of the nonvolatile memory module 200 using a nonvolatile memory library 124 and the memory management unit mapping table 144 of the kernel space 140. The RAM 220 may be a dual port static random access memory (SRAM).

The nonvolatile memory library 124 may include at least one instruction for efficiently managing the RAM 220 of the nonvolatile memory module 200.

For example, the at least one instruction may include cache line flush (CLFLUSH), optimized cache line flush (CLFLUSHOPT), cache line write back (CLWB), persistent commit (PCOMMIT), and the like associated with flushing write.

According to some embodiments of the inventive concept, the nonvolatile memory device may be one of a NAND flash memory, a vertical NAND flash memory (VNAND), a NOR flash memory, a resistive random access memory (RRAM), a phase-change memory (PRAM), a magnetoresistive random access memory (MRAM), a ferroelectric random access memory (FRAM), a spin transfer torque random access memory (STT-RAM), and the like. Also, the nonvolatile memory device may be implemented to have a three-dimensional array structure.

In some embodiments of the inventive concept, a three dimensional (3D) memory array may be provided. The 3D memory array may be monolithically formed in one or more physical levels of arrays of memory cells having an active area disposed above a substrate (e.g., silicon substrate) and circuitry associated with operation of those memory cells. Such associated circuitry may be above or within the substrate. It will be understood that the term "monolithic" means that layers of each level of the array are directly deposited on the layers of each underlying level of the array.

In some embodiments of the inventive concept, the 3D memory array may include vertical NAND strings that are vertically oriented such that at least one memory cell is located over another memory cell. The at least one memory cell may include a charge trap layer. Each vertical NAND string may include at least one select transistor located over memory cells, the at least one select transistor having the same structure as the memory cells and being formed monolithically together with the memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133, 8,553,466, 8,654,587, 8,559,235 and U.S. Patent Publication No. 2011/0233648.

Some embodiments of the inventive concept may be applied to both a flash memory in which a conductive floating gate is used as a charge storage layer and a charge trap flash (CTF) in which an insulating layer is used as a charge storage layer.

The computing system 10 according to some embodiments of the inventive concept may include a host 100 having the nonvolatile memory library 124 for accessing the RAM 220 of the nonvolatile memory module 200, and thus the computing system 10 may manage the nonvolatile memory module 200 more efficiently.

Figure 2:
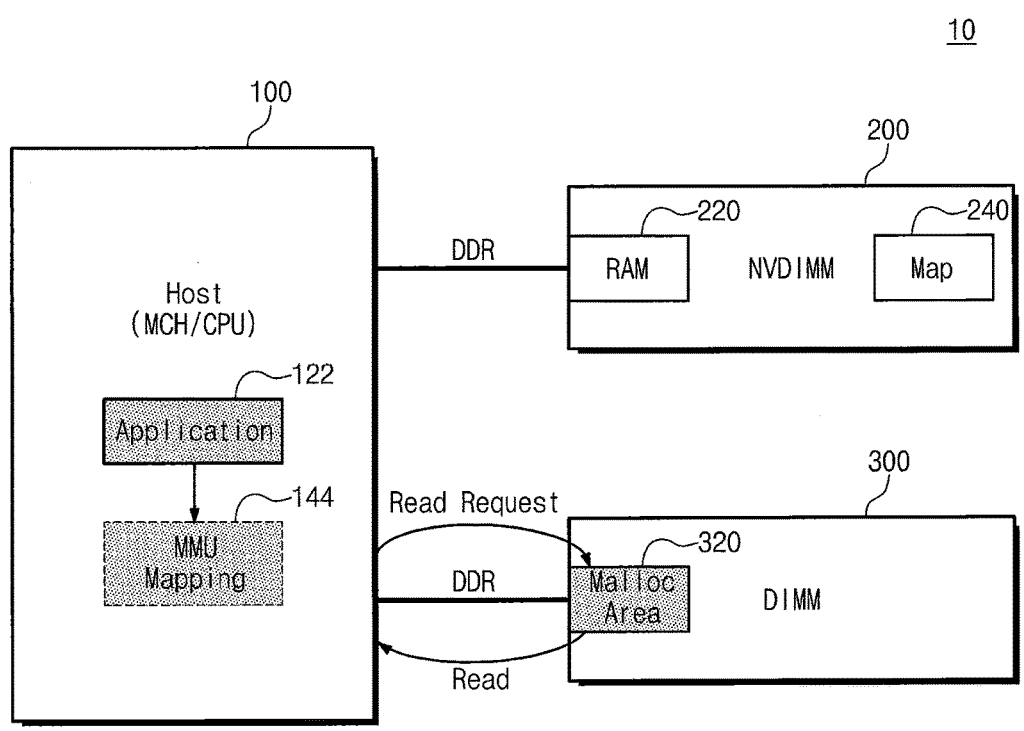
FIG. 2 is a diagram illustrating a read method of the computing system 10 according to some embodiments of the inventive concept.

FIG. 2 is a diagram illustrating a read method of the computing system 10 according to some embodiments of the inventive concept.

Referring to FIG. 2, the computing system 10 may include a host (MCH/CPU) 100, a nonvolatile memory module (NDIMM) 200, and a volatile memory module (DIMM) 300.

The host 100 may be a central processing unit (CPU), a co-processor, an arithmetic processing unit (APU), a graphic processing unit (GPU), a digital signal processor (DSP), a memory controller herb (MCH), or the like.

Although not illustrated, the host 100 may further include a memory management unit (MMU) for managing the nonvolatile memory module 200 and the volatile memory module 300.

The nonvolatile memory module 200 may transmit and receive data to and from the host 100 through the double data rate (DDR) interface.

The nonvolatile memory module 200, although not illustrated, may include at least one nonvolatile memory.

According to some embodiments, the nonvolatile memory module 200 may be implemented with a dual in-line memory module (DIMM).

According to some embodiments, the nonvolatile memory module 200 may be a NVDIMM-N type or a NVDIMM-F type.

The NVDIMM-N may include a DRAM and a flash memory for backup of the DRAM.

The NVDIMM-F may include a flash memory accessible as a block-oriented mass storage device.

Furthermore, the nonvolatile memory module 200 may include a RAM 220 that an application 122 of the host 100 may access and may store a map table 240 for managing the nonvolatile memory module 200.

The memory module 300 may transmit and receive data to and from the host 100 through a double data rate (DDR) interface.

The memory module 300, although not illustrated, may include at least one DRAM.

According to some embodiments, the memory module 300 may be implemented with a dual in-line memory module.

The memory module 300 may include a memory allocation area 320.

Here, the memory allocation area 320 may be an area which an application of the host 100 may be allowed to access.

During a read operation of the computing system 10, the host 100 may access the memory allocation area 320 of the memory module 300 to read data stored in the memory allocation area 320 of the memory module 300.

Furthermore, although not shown, each of the nonvolatile memory module 200 and the memory module 300 may be connected to the host 100 through a physical slot of the same communication interface.

The communication interface may be, for example, a DDR-series (e.g., DDR, DDR2, DDR3, DDR4, DDR5).

As illustrated in FIG. 2, a main memory managed by the host 100 may include the nonvolatile memory module 200 and the memory module 300.

The host 100 may perform management of the main memory (e.g., allocation of the main memory and/or deallocation of the main memory) using the memory management unit.

Figure 3:
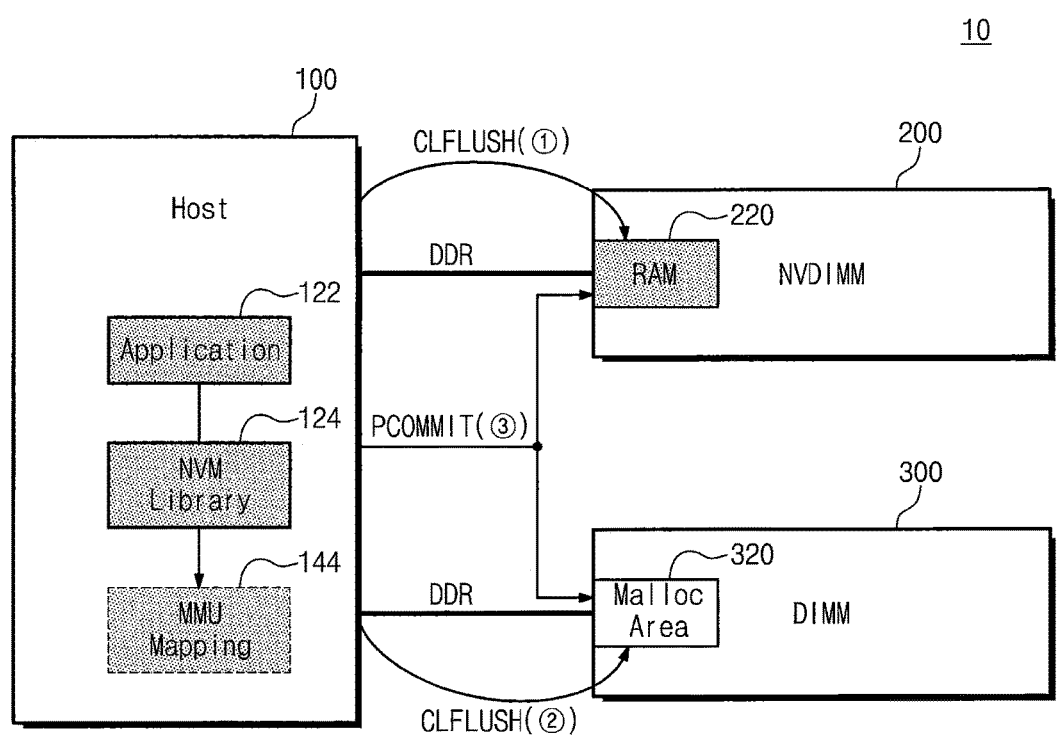
FIG. 3 is a block diagram illustrating a write method of the computing system 10 according to some embodiments of the inventive concept.

FIG. 3 is a block diagram illustrating a write method of the computing system 10 according to some embodiments of the inventive concept.

Referring to FIG. 3, a write method may be associated with flushing write.

The host 100 may transmit a flush instruction CLFLUSH and flush data to the nonvolatile memory module 200.

That is, cache data in the host 100 may be transmitted to the RAM 220 of the nonvolatile memory module 200 in response to the flush instruction CLFLUSH (①).

Afterwards, the host 100 may transmit the flush instruction CLFLUSH and flush data to the memory module 300.

That is, cache data in the host 100 may be transmitted as data of a memory allocation area 320 of the memory module 300 in the host 100 in response to the flush instruction CLFLUSH (②).

The host 100 may also transmit a commit instruction PCOMMIT to the nonvolatile memory module 200 and the memory module 300.

In response to the commit instruction PCOMMIT, the nonvolatile memory module 200 may transmit data transmitted to a memory controller to a nonvolatile memory in the nonvolatile memory module 200 to write back the data transmitted to the memory controller to the nonvolatile memory of the nonvolatile memory module 200.

While the memory module 300 transmits data transmitted to the memory controller in response to the commit instruction PCOMMIT, the memory module 300 may also transmit the data to a DRAM in the memory module 300. Thus, updating of cache data in the host 100 may be confirmed (③).

A write operation of the computing system 10 may include i) responding to the flush instruction CLFLUSH and ii) responding to the commit instruction PCOMMIT.

Although FIG. 3 illustrates that the flush instruction CLFLUSH is first transmitted to the nonvolatile memory module NVDIMM 200 and is then transmitted to the memory module DIMM 300, the scope and spirit of the inventive concept may not be limited thereto. The write operation of the inventive concept may be modified or changed such that the flush instruction CLFLUSH is first transmitted to the memory module DIMM 300 and is then transmitted to the nonvolatile memory module NVDIMM 200.

Figure 4:
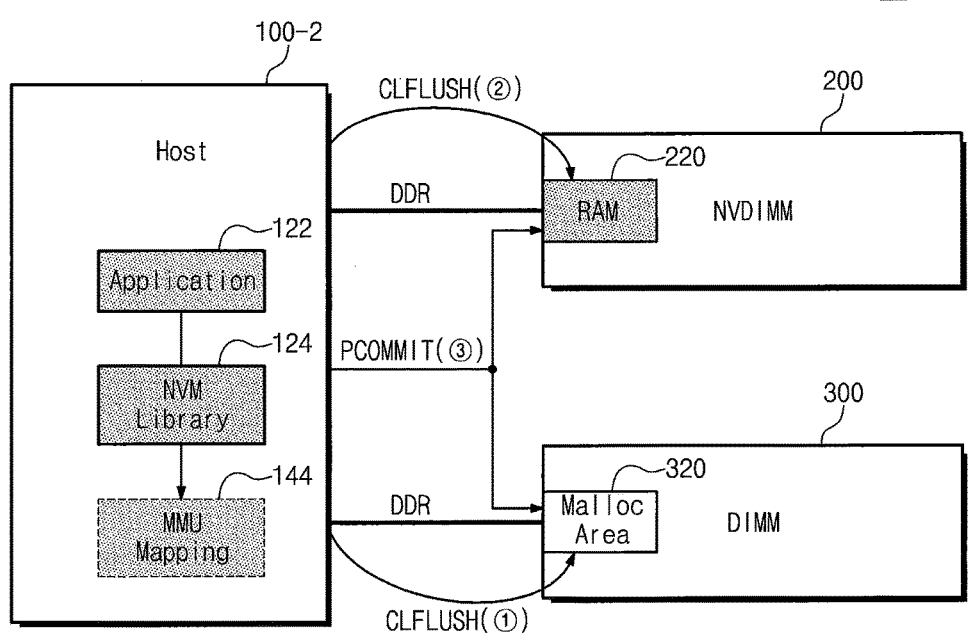
FIG. 4 is a block diagram illustrating a write method of a computing system 20 according to some embodiments of the inventive concept.

FIG. 4 is a block diagram illustrating a write method of an electronic device (e.g., computing system) according to some embodiments of the inventive concept.

Referring to FIG. 4, a computing system 20 may be different from that of FIG. 3 in that at a flush write operation of a host 100-2, a flush instruction CLFLUSH and flush data are first transmitted to a memory module 300 and are then transmitted to the nonvolatile memory module 200.

Figure 5:
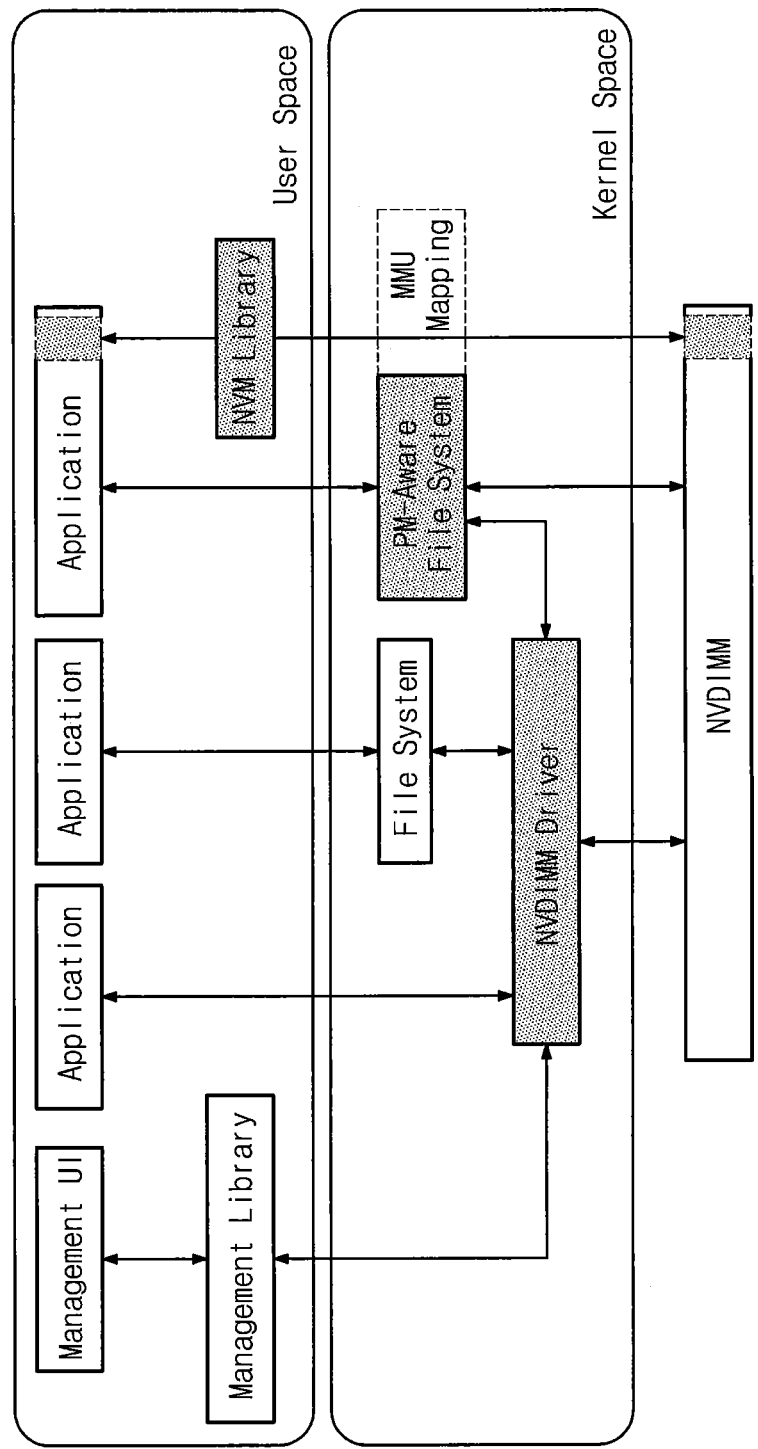
FIG. 5 is a block diagram illustrating firmware architecture of a nonvolatile memory module according to some embodiments of the inventive concept.

FIG. 5 is a block diagram illustrating firmware architecture of a nonvolatile memory module according to some embodiments of the inventive concept.

Referring to FIG. 5, an application may access a RAM of a nonvolatile memory module NVDIMM through a load/store interface which is accessible using a nonvolatile memory library NVM Library.

Furthermore, a nonvolatile memory module driver may access the nonvolatile memory module NVDIMM using a permanent memory aware file system or a file system.

Here, the nonvolatile memory module driver may communicate with the application programming interface API.

Furthermore, the application may directly access the nonvolatile memory module using a raw device access interface without being associated with the file system. The raw device may be an area where the file system is not set.

A management user interface may control the nonvolatile memory module driver using a management library.

The management library may include instructions for managing memory allocation, cancellation, and the like on a main memory (or a system memory) composing the memory module DIMM and/or the nonvolatile memory module NVDIMM.

In some embodiments, the host may set a mode of the nonvolatile memory module NVDIMM.

Figure 6:
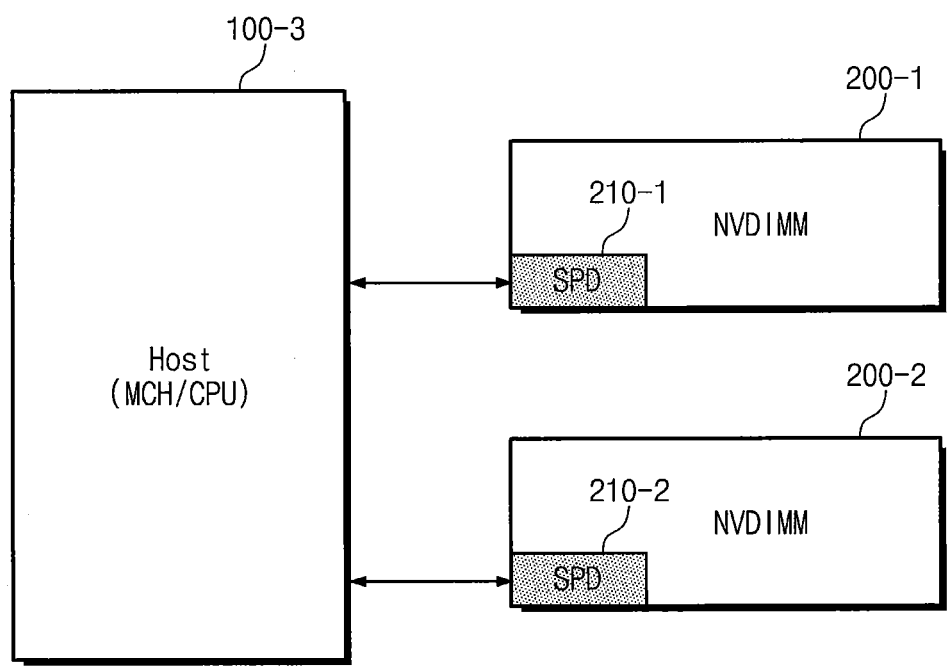
FIG. 6 is a diagram illustrating a computing system 30 according to some embodiments of the inventive concept.

FIG. 6 is a diagram illustrating an electronic device (e.g., computing system) 30 according to some embodiments of the inventive concept.

Referring to FIG. 6, a computing system 30 may include a host 100-3, a first nonvolatile memory module (NVDIMM) 200-1, and a second nonvolatile memory module 200-2.

During an initialization operation, the host 100-3 may read module information from a serial presence detect (SPD) 210-1 and 210-2 of the first and second nonvolatile memory modules 200-1 and 200-2 respectively.

The host 100-3 may set a mode of the first and second nonvolatile memory modules 200-1 and 200-2 respectively.

During the setting of the first nonvolatile memory module 200-1 with an NVDIMM-N mode (or a data backup store mode) and the second nonvolatile memory module 200-2 with an NVDIMM-F mode (or a storage device mode), the host 100-3 may generate corresponding module information and may transmit the corresponding module information to the SPDs 210-1 and 210-2 of the first and second nonvolatile memory modules 200-1 and 200-2, respectively.

Each of the first and second nonvolatile memory modules 200-1 and 200-2 may operate in the NVDIMM-F mode or in the NVDIMM-N mode.

Figure 7:
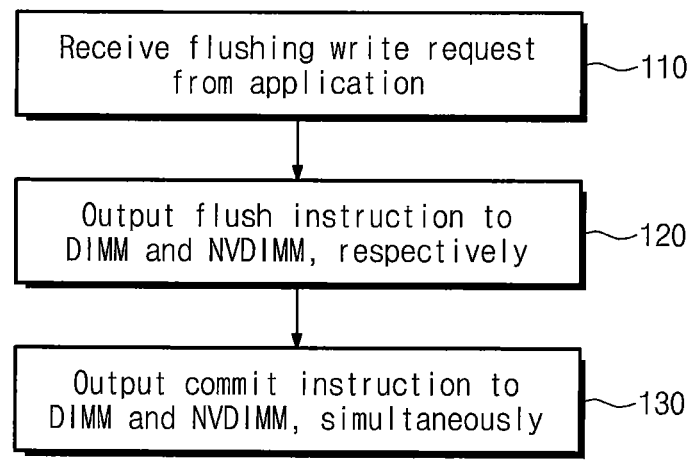
FIG. 7 is a flow chart illustrating a write method of a computing system according to some embodiments of the inventive concept.

FIG. 7 is a flow chart illustrating a write method of an electronic device (e.g., computing system) according to some embodiments of the inventive concept.

Below, a write method of a computing system will be described with reference to FIGS. 1 to 7.

A flushing write request may be received from an application (Block 110).

The host 100 may output the flush instruction CLFLUSH and corresponding flush data to each of the memory module DIMM and the nonvolatile memory module NVDIMM (Block 120). After a predetermined time, the host 100 may transmit a commit instruction PCOMMIT to the nonvolatile memory module 200 and the memory module 300 in parallel.

In response to the commit instruction PCOMMIT, flush data stored in an allocation area of the memory module DIMM may be stored in an internal DRAM and flush data stored in the RAM of the nonvolatile memory module NVDIMM may be stored in an internal nonvolatile memory NVM (Block 130).

The write method of the computing system according to some embodiments of the inventive concept may perform a flushing write operation with respect to the memory module DIMM and the nonvolatile memory module NVDIMM using the flush instruction CLFLUSH and the commit instruction PCOMMIT.

For a computing system comprising a host, a nonvolatile memory module and a memory module, a write method of the computing system may include outputting a flush instruction and flush data to the nonvolatile memory module, outputting the flush instruction and the flush data to the memory module, and outputting a commit instruction to the nonvolatile memory module and the memory module.

The write method may further include receiving a flush write request from an application.

The write method may further include storing the flush data in a RAM of the nonvolatile memory module in response to the flush instruction.

The host may include a kernel space and a user space, and the user space may include a nonvolatile memory library including at least one instruction for accessing the nonvolatile memory module.

The kernel space may include a memory management unit mapping table for managing an address of the RAM of the nonvolatile memory module.

The outputting of the flush instruction and the flush data to the memory module may be performed after the outputting of the flush instruction and the flush data to the nonvolatile memory module.

The outputting of the flush instruction and the flush data to the nonvolatile memory module may be performed after the outputting of the flush instruction and the flush data to the memory module.

The write method may further include storing flush data stored in the RAM of the nonvolatile memory module in an internal nonvolatile memory of the nonvolatile memory module in response to the flush instruction.

The write method may further include storing the flush data in a memory allocation area of the memory module in response to the flush instruction, and storing flush data stored in the RAM of the memory module in an internal DRAM of the memory module in response to the flush instruction.

The write method may further include storing data in the nonvolatile memory module using a permanent memory aware file system of the kernel space.

The write method may further include setting a mode of the nonvolatile memory module, and the mode of the nonvolatile memory module may be one of a store mode and a data store mode.

A computing system according to some embodiments of the inventive concept may include a host, at least one memory module communicating with the host with a double data rate (DDR) interface, and at least one nonvolatile memory module communicating with the host with the DDR interface. The host may read data from a memory allocation area of the memory module in response to a read request and may transmit write data to the memory module and the nonvolatile memory module in response to a write request, respectively.

The write request may be a flushing write request. The host may transmit a flush instruction and flush data to the memory module and the nonvolatile memory module in response to the flush write request and may then transmit the commit instruction to the memory module and the nonvolatile memory module.

The host may include a kernel space and a user space. An application of the user space may access a RAM of the nonvolatile memory module using a nonvolatile memory library of the kernel space. A memory management unit mapping table of the kernel space may be used at an access operation about the RAM of the nonvolatile memory module.

The nonvolatile memory module may include at least one nonvolatile memory and at least one DRAM.

A memory management method of an electronic device (e.g., computing system) according to some embodiments of the inventive concept will be described hereafter.

A memory management method of an electronic device (e.g., computing system) according to some embodiments of the inventive concept may be configured to set page data as a read/write mode, may be configured to copy the page data of the nonvolatile memory to a DRAM, and may be configured to allocate the copied page data as a read only mode.

Figure 8:
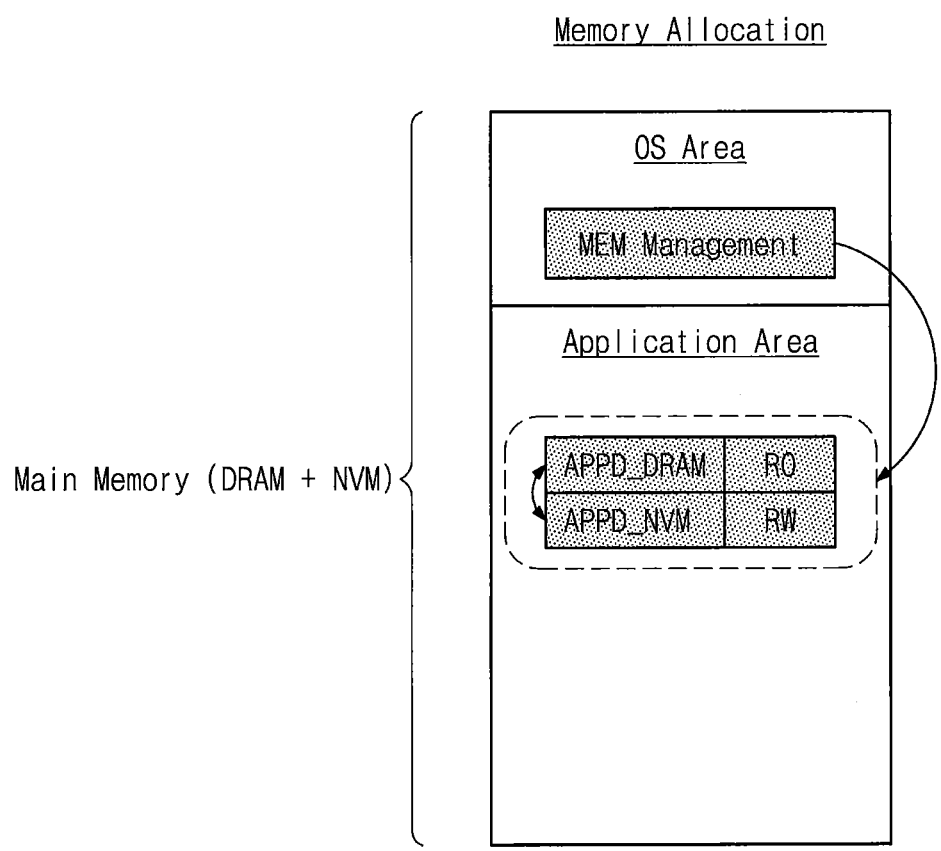
FIG. 8 is a schematic diagram describing memory allocation according to some embodiments of the inventive concept.

FIG. 8 is a schematic diagram describing memory allocation according to some embodiments of the inventive concept. Referring to FIG. 8, memory allocation may divide a main memory into an operating system (OS) area and an application area. The main memory according to some embodiments of the inventive concept may be implemented with a DRAM (dynamic random access memory) and a NVM (nonvolatile memory).

The OS area may store a memory management unit for managing the main memory. The application area may store first application data APPD_DRAM and second application data ADDP_NVM. Here, the first application data APPD_DRAM may be application data stored in the DRAM, and the second application data APPD_NVM may be application data stored in the NVM.

According to some embodiments of the inventive concept, the memory management unit may manage the first application data APPD_DRAM as a read only (RO) mode and the second application data APPD_NVM as a read/write (RW) mode.

According to some embodiments of the inventive concept, the memory management unit may convert the second application data APPD_NVM into the first application data APPD_DRAM. According to some embodiments of the inventive concept, the memory management unit may convert the first application data ADDP_DRAM into the second application data APPD_NVM.

A memory allocation method according to some embodiments of the inventive concept may allocate a DRAM for storing application data as the RO mode and the nonvolatile memory as the RW mode, thereby optimizing the performance of the computing system.

FIG. 9 is a diagram illustrating a memory management method of an electronic device (e.g., computing system) according to some embodiments of the inventive concept. Referring to FIG. 9, a computing system 10a may include a processor 100a, a memory module (DIMM) 200a, and a nonvolatile memory module (NVDIMM) 300a.

The processor 100a may be a central processing unit (CPU), a co-processor, an arithmetic processing unit (APU), a graphic processing unit (GPU), a digital signal processor (DSP), a memory controller herb (MCH), or the like. The memory module 200a may transmit and receive data to and from the processor 100a through a double data rate (DDR) interface. Although not illustrated, the processor 100a may further include a memory management unit (MMU) for managing the memory module 200a and the nonvolatile memory module 300a.

The memory module 200a, although not illustrated, may include at least one DRAM. According to some embodiments of the inventive concept, the memory module 200a may be implemented with a dual in-line memory module (DIMM).

The nonvolatile memory module 300a may transmit and receive data to and from the processor 100a with the DDR interface. The nonvolatile memory module 300a, although not illustrated, may include at least one nonvolatile memory. According to some embodiments of the inventive concept, the nonvolatile memory module 300a may be implemented with a dual in-line memory module (DIMM). According to some embodiments of the inventive concept, the nonvolatile memory module 300a may be of a NVDIMM-N type or a NVDIMM-F type. Here, the NVDIMM-N May include a DRAM and a flash memory for backup of the DRAM. The NVDIMM-F may include a flash memory accessible to a block-oriented mass storage device.

Furthermore, although not shown, each of the memory module 200a and the nonvolatile memory module 300a may be connected to the processor 100a through a physical slot of the same communication interface. The communication interface may be, for example, suitable for a DDR-series (e.g., DDR, DDR2, DDR3, DDR4, DDR5, etc.).

As illustrated in FIG. 9, the main memory that the processor 100a manages may include the memory module 200a and the nonvolatile memory module 300a. The processor 100a may perform management of the main memory (e.g., allocation of the main memory and/or deallocation of the main memory) using the memory management unit.

A memory allocation method of the computing system 10a may be performed as follows.

An application may request the processor 100a to allocate a volatile memory (VMEM) about application data APPD (①). For clear and concise description, it is assumed that the application data APPD is stored (or backed up) in the nonvolatile memory module 300a. Although not illustrated, it will be understood that the application data APPD may be stored in a storage device (e.g., a hard disk drive (HDD), a solid state drive (SDD), HSSD, or the like) through a peripheral controller hub (HCH) connected to the processor 100a, not in the nonvolatile memory module 300a connected to the processor 100a. Here, the peripheral controller hub may be called "chip set" or "North Bridge".

According to some embodiments of the inventive concept, a volatile memory allocation request (hereinafter referred to as "VMEM allocation request") of an application may utilize a C language. For example, the VMEM allocation request may be performed using a function of "malloc( )".

The processor 100a may copy application data APPD of the nonvolatile memory module 300a to the memory module 200a in response to the VMEM allocation request. In this case, the processor 100a may allocate (or set) the RO mode to the attribute about the application data APPD copied to the memory module 200a. That is, the application data of the memory module 200a may be set as read only (RO) data (②).

After the setting, the application may perform read only operation from the memory module 200a (③).

The memory management method of the computing system 10a according to some embodiments of the inventive concept may set application data (APPD) stored in the memory module 100a as the RO mode.

FIG. 10 is a diagram illustrating a memory management method of an electronic device (e.g., computing system) according to some embodiments of the inventive concept. Hereafter, a memory allocation method of the computing system 10a will be described with reference to FIG. 10.

A main memory read method may be performed as follows. An application may transfer (e.g., transmit) a read request for application data APPD stored in the main memory, in particular, the memory module 200a to the processor 100a. The processor 100a may read application data APPD_R stored in the memory module 200a in response to the read request and may transfer the read application data to the application. Here, since the application data APPD_R stored in the memory module 200a is set as the RO mode, a read operation may be normally performed according to a read request of the application (①).

A main memory write method may be performed as follows. The application may request the main memory, in particular, the memory module 200a to write application data APPD_W. The processor 100a may write application data APPD_W in the memory module 200a in response to the write request. However, since the memory module 200a is set as the RO mode, the write operation may fail. For example, the memory module 200a may issue a memory write access fault in response to the write request (②). The processor 100a may perform writing of the application data APPD_W in the nonvolatile memory module 300a in response to a write operation fault check of the memory module 200a. Since the nonvolatile memory module 300a is set as the RW mode, a write failure may not occur. According to some embodiments of the inventive concept, the above-described write operation of nonvolatile memory module 300a may be performed on a static random access memory (SRAM) (not illustrated) of nonvolatile memory module 300a. After the write operation, the application may access the nonvolatile memory module 300a to read the application data APPD_W (③).

The write operation of the computing system 10a according to some embodiments of the inventive concept should be understood as being not limited to the above description. The processor 100a may first determine a mode(e.g., RO mode or RW mode) of the main memory in which a write operation is performed in response to the write request of the application and then may perform the write operation based on information on a mode of the main memory. For example, in the case where the write request is determined as being a write request about the memory module 200a of the RO mode, the processor 100a may allow the application data APPD_W to be stored in the nonvolatile memory module 300a without delay. A write operation may not be performed on the memory module 200a before a write operation on the nonvolatile memory module 300a.

The memory management method of the computing system 10a according to some embodiments of the inventive concept may perform a read operation on the memory module 200a and may perform a write operation on the nonvolatile memory module 300a.

Figure 11:
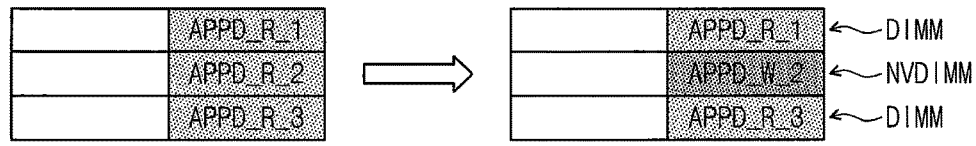
FIG. 11 is a diagram illustrating a write operation illustrated in FIG. 10 according to some embodiments of the inventive concept.

FIG. 11 is a diagram illustrating a write operation illustrated in FIG. 10 according to some embodiments of the inventive concept. Referring to FIGS. 10 and 11, first page data APPD_R_1, second page data APPD_R_2, and third page data APPD_R_3 may be stored in the memory module 200a. Since being set as the "read only" mode, the memory module 200a may perform a read operation only. In FIG. 11, it may be assumed that update for the second page data APPD_R_2 is required. An application may first request the processor 100a to update the second page data APPD_R_2 of the memory module 200a.

First of all, the processor 100a may control the memory module 200a in response to an update request so as to write new page data APPD_W_2 in an area corresponding to an address through which the second page data APPD_R_2 is stored in the memory module 200a. Since being set as the RO mode, the memory module 200a may inform the processor 100a that the write request fails. The processor 100a may control the nonvolatile memory module 300a in response to the write request failure so as to store the new page data APPD_W_2 in an SRAM of the nonvolatile memory module 300a.

Figure 12:
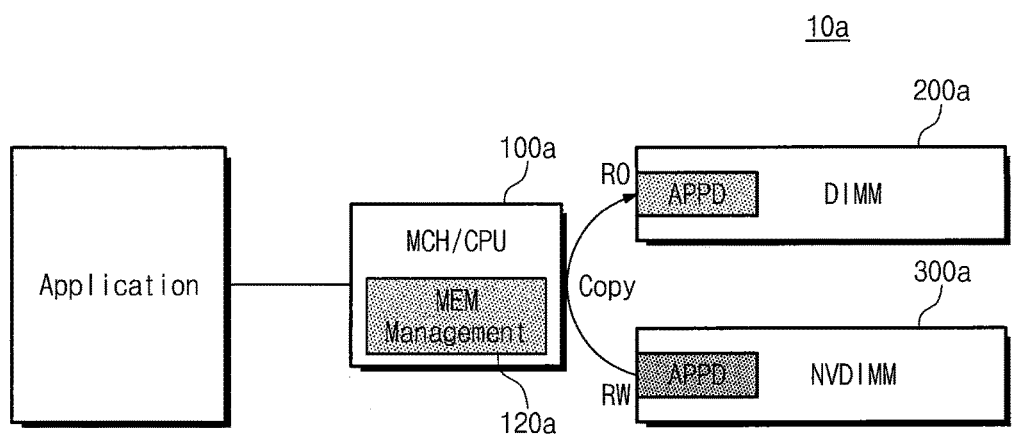
FIG. 12 is a diagram illustrating a memory management method of a computing system according to some embodiments of the inventive concept.

FIG. 12 is a diagram illustrating a memory management method of an electronic device (e.g., computing system). Referring to FIGS. 8 to 12, when page data stored in the nonvolatile memory module 300a exceeds a reference value, the memory management unit 120a may copy application data APPD stored in the nonvolatile memory module 300a to the memory module 200a. The application data APPD of the nonvolatile memory module 300a may be copied to the memory module 200a in a background operation without a separate request from the host 100a. Here, the application data APPD copied to the memory module 200a may be set as the RO mode.

Figure 13:
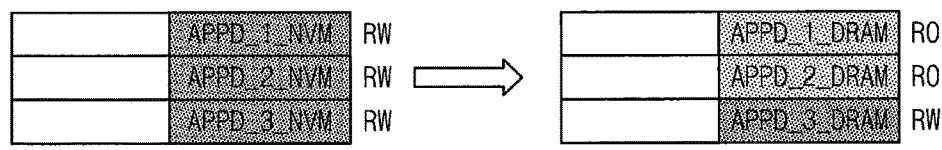
FIG. 13 is a diagram illustrating a back ground copy method illustrated in FIG. 12 according to some embodiments of the inventive concept.

FIG. 13 is a diagram illustrating a background copy method illustrated in FIG. 12.

For the purpose of description, it may be assumed that first page data APPD_1_NVM, second page data APPD_2_NVM, and third page data APPD_3_NVM are stored in the nonvolatile memory module 300a. When the number of pieces of page data stored in the nonvolatile memory module 300a exceeds a predetermined value, at least one page data (e.g., the first page data APPD_1_NVM and the second page data APPD_2_NVM), which is selected according to a predetermined method from among the first page data APPD_1_NVM, the second page data APPD_2_NVM and the third page data APPD_3_NVM, may be copied to the memory module 200a. At this time, the memory module 200a may store the first page data APPD_1_NVM and the second page data APPD_2_NVM that are copied to the memory module 200a.

Pieces of page data APPD_1_NVM and APPD_2_NVM of the nonvolatile memory module 300a that are allocated to an application may be changed into pieces of page data APPD_1_DRAM and APPD_2_DRAM of the memory module 200a that are set as a RO mode, respectively. The page data set as a RW mode of the nonvolatile memory module 300a may be collected as page data set as a RO mode.

Memory management between the memory module 200a and the nonvolatile memory module 300a is described with reference to FIGS. 9 to 13. However, the scope and spirit of the inventive concept may not be limited thereto. The memory management method according to embodiments of the inventive concept may be used for memory management between at least one DRAM and at least one nonvolatile memory in the nonvolatile memory module 300a. A processor may be able to access both the DRAM and the nonvolatile memory in the nonvolatile memory module 300a.

Figure 14:
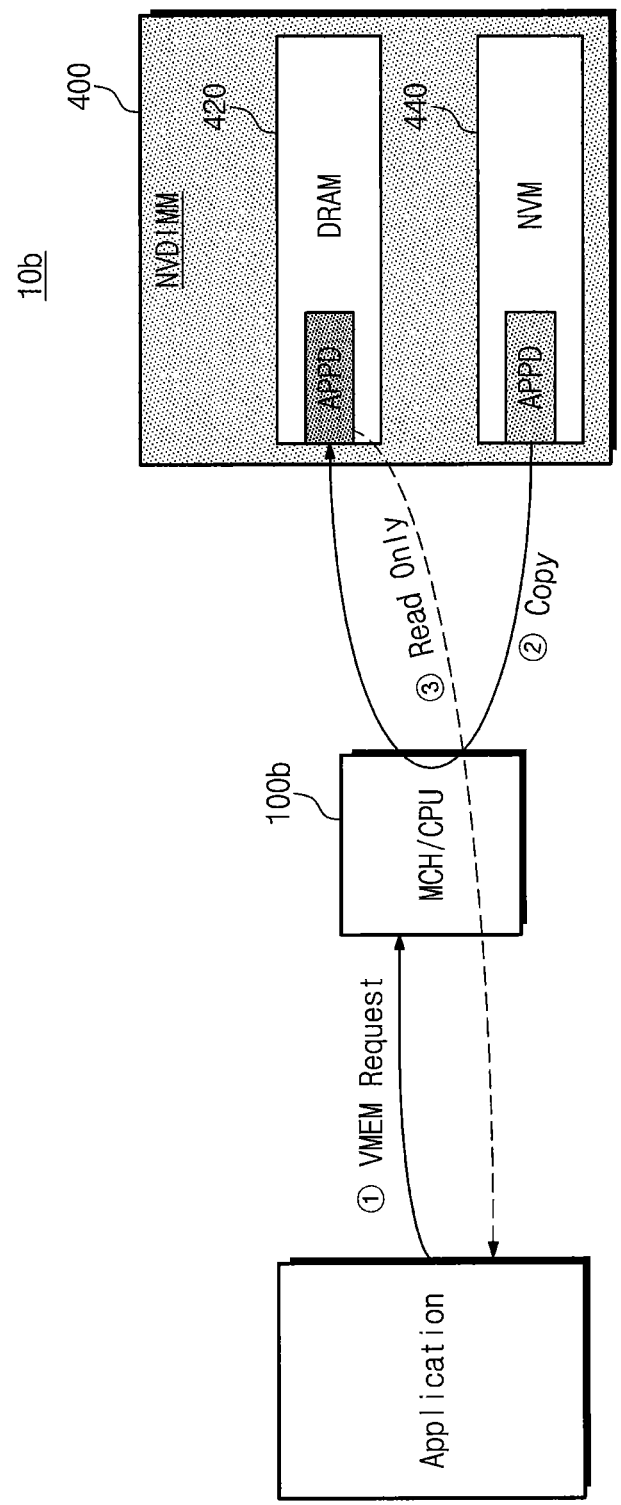
FIG. 14 is a diagram illustrating a memory management method of a computing system according to some embodiments of the inventive concept.

FIG. 14 is a diagram illustrating a memory management method of an electronic device (e.g., computing system) 10b. Referring to FIG. 14, a NVDIMM 400 may include at least one DRAM 420 and at least one NVM 440.

A memory allocation method of a computing system 10b may be performed as follows. An application may request volatile memory (VMEM) allocation about application data APPD to a processor 100b (①). The processor 100b may copy application data APPD of NVM 440 to the DRAM 420 in response to a VMEM allocation request. At this time, the application data APPD of the DRAM 420 may be allocated to the application as "read only" (②). Afterwards, the application may only read the application data APPD from the DRAM 420 (③).

Figure 15:
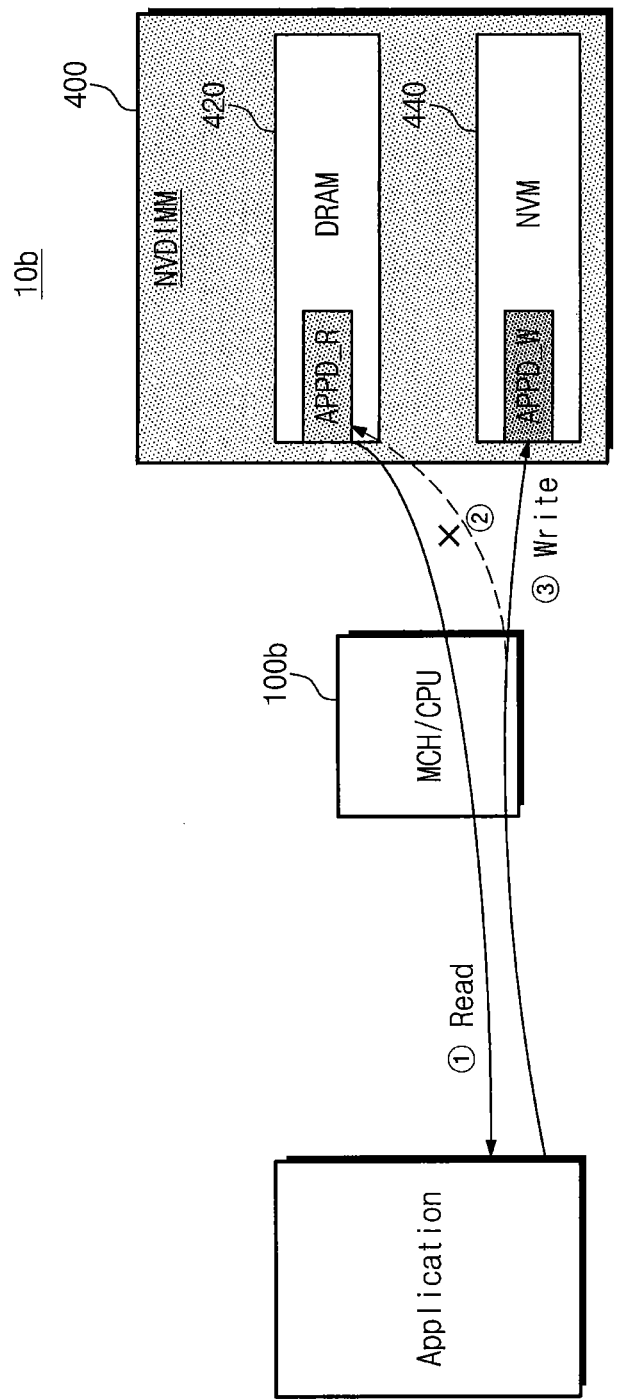
FIG. 15 is a diagram illustrating a memory management method of a computing system according to some embodiments of the inventive concept.

FIG. 15 is a diagram illustrating a memory management method of an electronic device (e.g., computing system) 10b according to some embodiments of the inventive concept. Below, a read method and a write method about a main memory of a computing system 10b, a NVDIMM 400, will be described with reference to FIG. 15.

A memory read method may be performed as follows. An application may send, to the processor 100b, a read request about application data APPD stored in the DRAM 420. The processor 100b may read application data APPD_R stored in the DRAM 420 in response to the read request and may output the read data to the application (①).

A memory write method may be performed as follows. The application may request the DRAM 420 to write application data APPD_W. The processor 100b may perform a write operation about the application data APPD_W on the DRAM 420 in response to the write request. However, since the DRAM 420 is set as the RO mode, a write operation may fail (②). The processor 100b may write the application data APPD_W in NVM 440 in response to a write operation failure check of the DRAM 420. After the above-described write operation, the application may access NVM 440 to read the application data APPD_W (③).

Figure 16:
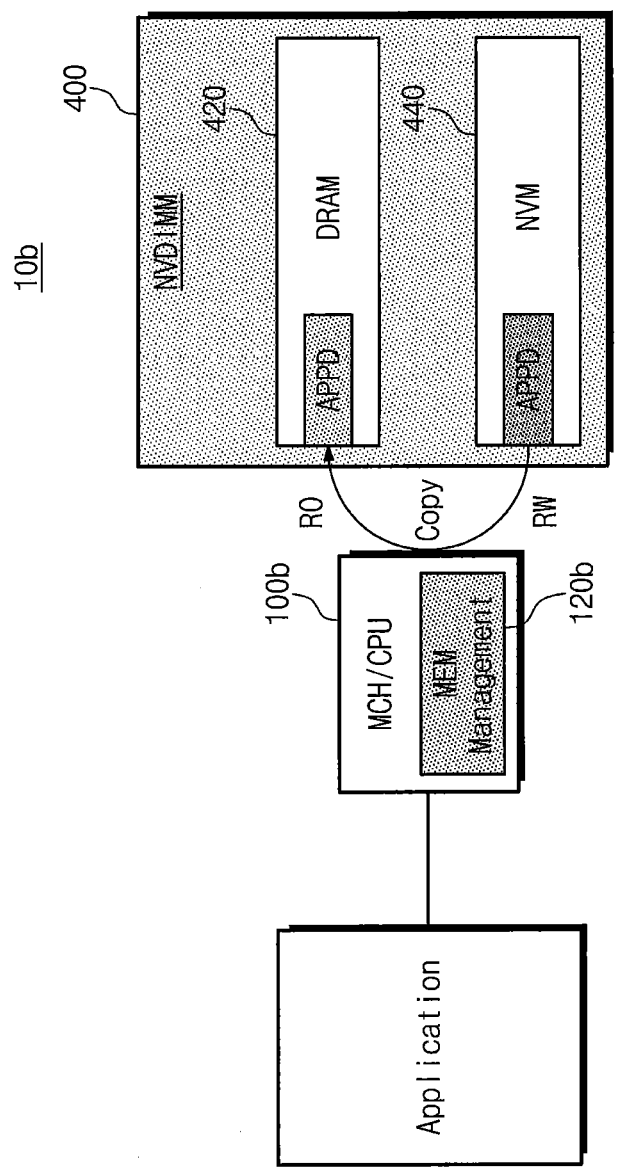
FIG. 16 is a diagram illustrating a memory management method of a computing system according to some embodiments of the inventive concept.

FIG. 16 is a diagram illustrating a memory management method of an electronic device (e.g., computing system) 10b according to some embodiments of the inventive concept. Referring to FIGS. 14 to 16, when the number of pieces of page data stored in NVM 440 exceeds a reference value, a memory management unit 120b may copy application data APPD stored in NVM 440 to the DRAM 420 by a background manner.

Figure 17:
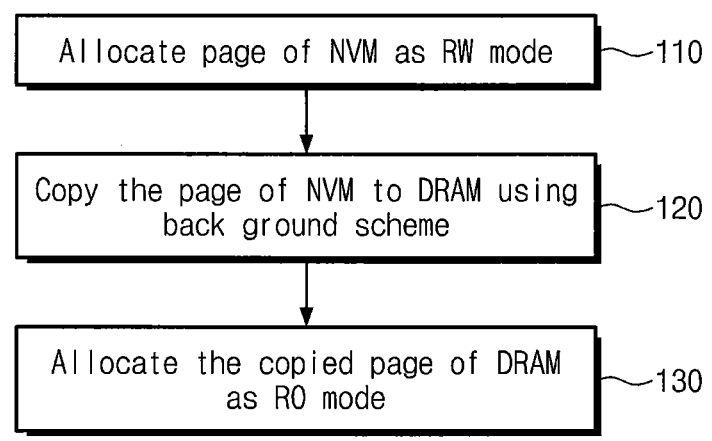
FIG. 17 is a flow chart illustrating a memory management method of a computing system according to some embodiments of the inventive concept.

FIG. 17 is a flow chart illustrating a memory management method of an electronic device (e.g., computing system) according to some embodiments of the inventive concept. Below, a memory management method will be described with reference to FIGS. 8 to 17.

Page data stored in a NVM (nonvolatile memory) may be allocated as a RW mode. This may make it possible to read page data from the NVM and write page data to the NVM (Block 210). The page data of the NVM may be copied to a DRAM using a background operation. Here, the background operation may be variously activated according to a policy of a memory management unit (Block 220). A write operation of the DRAM may be performed according to the background operation, but the inventive concept should be understood as being not limited thereto. Page data allocated to the DRAM may be allocated as a RO mode. That is, an application may perform read only operation on the page data of the DRAM (Block 230).

The memory management method of the computing system of the inventive concept may copy page data of the NVM to the DRAM in the background operation and may set the copied page data of the DRAM as a read mode.

A memory management method about application data is described with reference to FIGS. 8 to 17. However, the scope and spirit of the inventive concept may not be limited thereto. The memory management method of the inventive concept may be applied to changeable operating system (OS) data.

Figure 18:
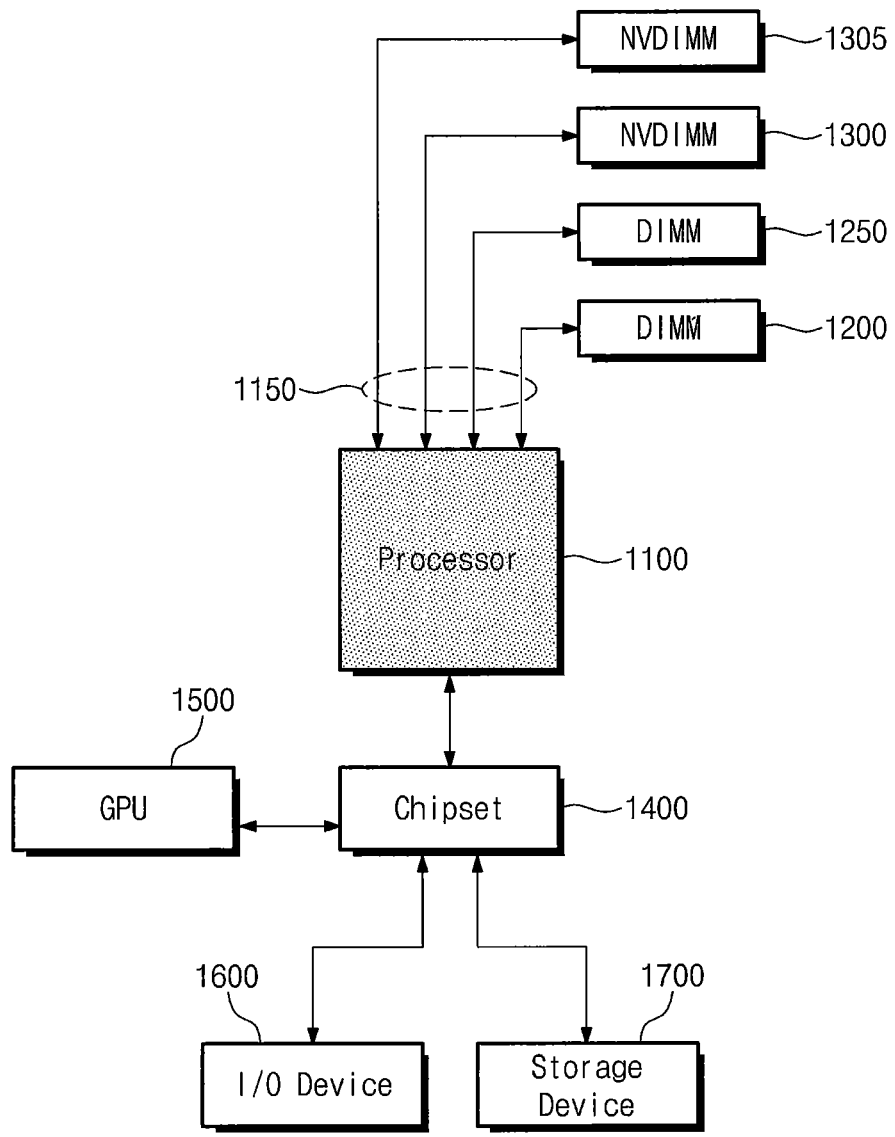
FIG. 18 is a block diagram illustrating a computing system 1000 according to some embodiments of the inventive concept.

FIG. 18 is a block diagram illustrating an electronic device (e.g., computing system) 1000 according to some embodiments of the inventive concept. Referring to FIG. 18, a computing system 1000 may include a processor 1100, memory modules (DIMM) 1200 and 1250, nonvolatile memory modules (NVDIMM) 1300 and 1305, a chipset 1400, a graphic processing unit (GPU) 1500, an input/output device 1600, and a storage device 1700.

The processor 1100 may control an overall operation of the computing system 1000. The processor 1100 may perform various operations of the computing system 1000. The processor 1100 may be implemented with the processor (e.g., one of 100, 100-2, 100-3, 100a and 100b) described with reference to FIGS. 1 to 10).

The memory modules 1200 and 1250 and the nonvolatile memory modules 1300 and 1305 may be directly connected with the processor 1100. For example, each of the memory modules 1200 and 1250 and the nonvolatile memory modules 1300 and 1305 may have a DIMM shape. In some embodiments, each of the memory modules 1200 and 1250 and the nonvolatile memory modules 1300 and 1305 may be mounted on a DIMM socket directly connected with the processor 1100 and may communicate with the processor 1100.

Each of the nonvolatile memory modules 1300 and 1305 may be the nonvolatile memory module 300 or 400 described with reference to FIGS. 1 to 17.

The memory modules 1200 and 1250 and the nonvolatile memory modules 1300 and 1305 may communicate with the processor 1100 through the same interface 1150. For example, the memory modules 1200 and 1250 and the nonvolatile memory modules 1300 and 1305 may communicate with each other through the DDR interface 1150. In example embodiments, the processor 1100 may use the memory modules 1200 and 1250 as a working memory, a buffer memory, or a cache memory of the computing system 1000.

The chipset 1400 may be electrically connected with the processor 1100 and may control hardware of the computing system 1000 in response to control of the processor 1100. For example, the chipset 1400 may be connected with the GPU 1500, the input/output device 1600, and the storage device 1700 through primary buses and may perform a bridge role about the primary buses.

The GPU 1500 may perform a set of arithmetic operations for outputting image data of the computing system 1000. In example embodiments, the GPU 1500 may be embedded in the processor 1100 in the form of a system on chip.

The input/output device 1600 may include various devices which receive data or commands from the computing system 1000 or output data to an external device. For example, the input/output device 1600 may include user input devices such as a keyboard, a keypad, a button, a touch panel, a touch screen, a touch pad, a touch ball, a microphone, a gyroscope sensor, a vibration sensor, a piezoelectric sensor, and the like and user output devices such as a liquid crystal display (LCD), an organic light emitting diode (OLED) display device, an active matrix OLED (AMOLED) display device, a light emitting diode, a speaker, a motor, and the like.

The storage device 1700 may be used as a storage medium of the computing system 1000. The storage device 1700 may include mass storage media such as a hard disk drive (HDD), a solid state drive (SSD), a memory card, a memory stick, and the like.

In example embodiments, the nonvolatile memory modules 1300 and 1305 may be used as a storage medium of the computing system 1000 through the processor 1100. An interface between the nonvolatile memory modules 1300 and 1305 and the processor 1100 may be higher in speed than that between the storage device 1700 and the processor 1100. That is, the processor 1100 may use the nonvolatile memory modules 1300 and 1305 as storage media, thereby improving the performance of the computing system 1000.

Figure 19:
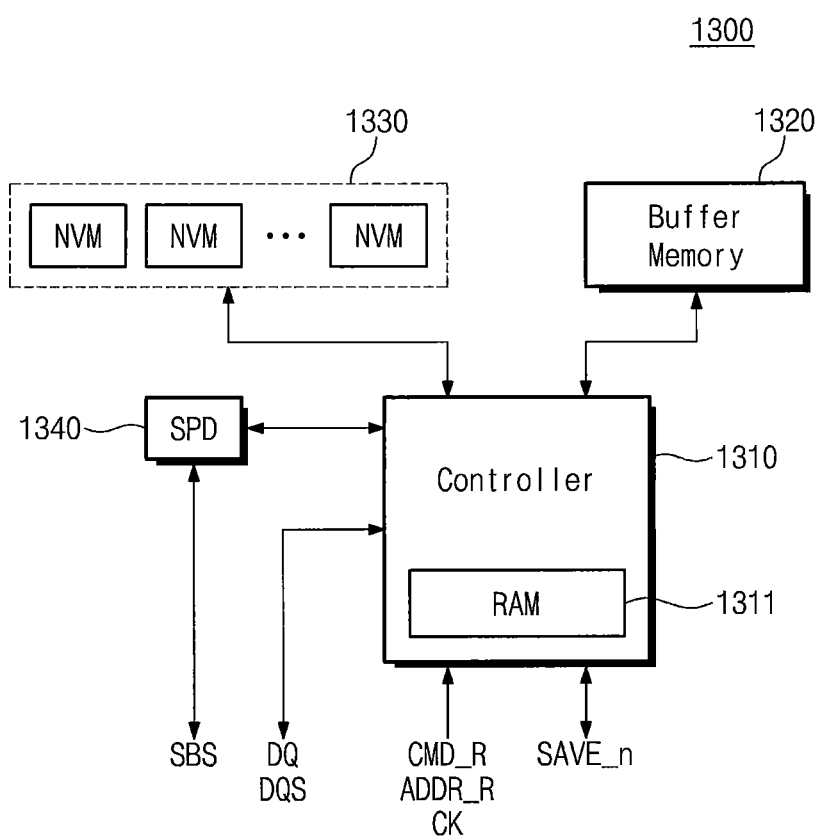
FIG. 19 is a block diagram illustrating one of nonvolatile memory modules of FIG. 18 according to some embodiments of the inventive concept.

FIG. 19 is a block diagram illustrating one of nonvolatile memory modules of FIG. 18, according to some embodiments of the inventive concept. In example embodiments, the nonvolatile memory module 1300 may have a load reduced DIMM (LRDIMM) form as illustrated in FIG. 19. In example embodiments, the nonvolatile memory module 1300 illustrated in FIG. 19 may be a dual in-line memory module (DIMM) and may be mounted on a DIMM socket so as to communicate with the processor 1100.

Referring to FIG. 19, the nonvolatile memory module 1300 may include a nonvolatile memory module controller 1310, a buffer memory 1320, a nonvolatile memory device 1330, and a serial presence detect chip (SPD) 1340. The nonvolatile memory module 1300 may include a RAM 1311. In example embodiments, the nonvolatile memory device 1330 may include a plurality of nonvolatile memories NVM. Each of the nonvolatile memories included in the nonvolatile memory device 1330 may be implemented with a chip, a package, a device, or a module. In some embodiments, the nonvolatile memory device 1330 may be implemented with a chip or a package.

In example embodiments, the nonvolatile memory module controller 1310 may transmit and receive a plurality of data signals DQ and a plurality of data strobe signals DQS to and from the processor 1100 and may receive a RAM command CMD_R, a RAM address ADDR_R, and a clock CK through separate signal lines.

The SPD 1340 may be an electrically erasable and programmable ROM (EEPROM). The SPD 1340 may include initial information or device information of the nonvolatile memory module 1300. In example embodiments, the SPD 1340 may include initial information or device information such as a module type, a module configuration, a storage capacity, a module kind, an execution environment, and the like of the nonvolatile memory module 1300. When a computing system including the nonvolatile memory module 1300 is booted up, the processor 1100 of the computing system may read the SPD 1340 and may recognize the nonvolatile memory module 1300 based on the read result. The processor 1100 may use the nonvolatile memory module 1300 as a storage medium based on the SPD 1340.

In example embodiments, the SPD 1340 may communicate with the processor 1100 through a side-band communication channel. The processor 1100 may exchange a side-band signal SBS with the SPD 1340 through the side-band communication channel. In example embodiments, the SPD 1340 may communicate with the nonvolatile memory module controller 1310 through the side-band communication channel. In example embodiments, the side-band communication channel may be based on I2C communication. In example embodiments, the SPD 1340, the nonvolatile memory module controller 1310, and the processor 1100 may communicate with each other or may exchange data with each other, based on the I2C communication.

Figure 20:
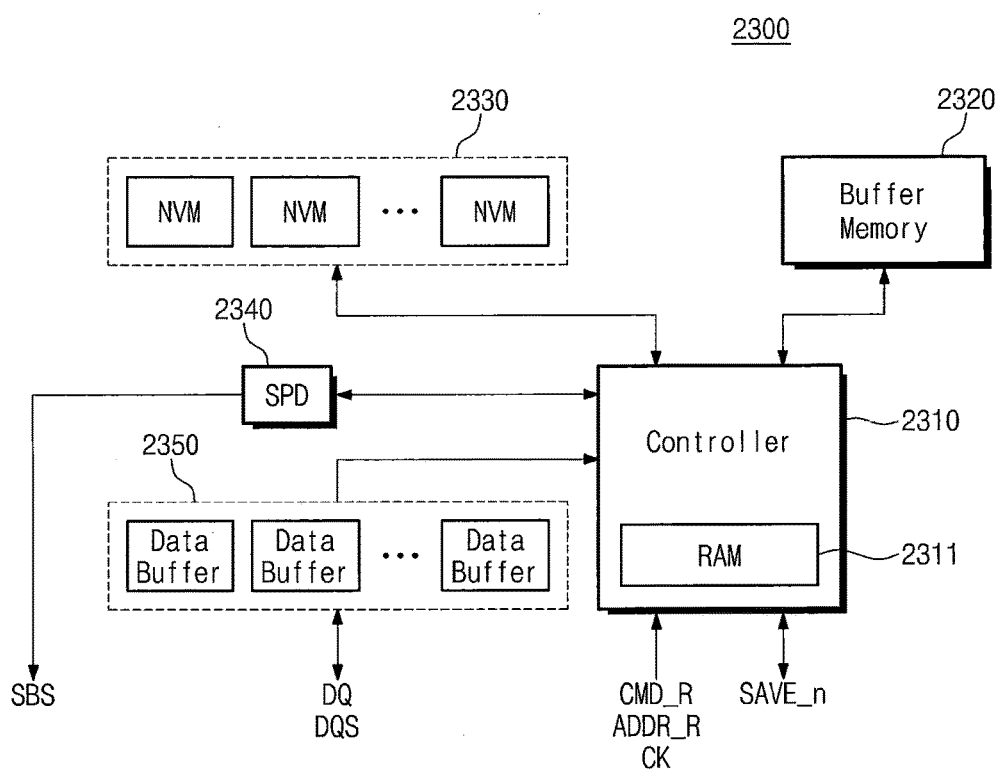
FIG. 20 is a block diagram illustrating one of nonvolatile memory modules of FIG. 18 according to some embodiments of the inventive concept.

FIG. 20 is a block diagram illustrating one of nonvolatile memory modules of FIG. 18 according to some embodiments of the inventive concept. In example embodiments, a nonvolatile memory module 2300 may have a registered DIMM (RDIMM) form as illustrated in FIG. 20. In example embodiments, the nonvolatile memory module 2300 illustrated in FIG. 20 may be a dual in-line memory module (DIMM) and may be mounted on a DIMM socket so as to communicate with the processor 1100.

Referring to FIG. 20, the nonvolatile memory module 2300 may include a nonvolatile memory module controller 2310, a buffer memory 2320, a nonvolatile memory device 2330, a serial presence detect chip (SPD) 2340, and a data buffer circuit 2350. The nonvolatile memory module controller 2310 may include a RAM 2311.

The data buffer circuit 2350 may receive information or data from the processor 1100 (e.g., processor 1100 in FIG. 18) through a data signal DQ and a data strobe signal DQS and may transfer the received information or data to the nonvolatile memory module controller 2310. Alternatively, the data buffer circuit 2350 may receive information or data from the nonvolatile memory module controller 2310 and may transfer the received information or data to the processor 1100 through a data signal DQ and a data strobe signal DQS.

In example embodiments, the data buffer circuit 2350 may include a plurality of data buffers. Each of the data buffers may exchange the data signal DQ and the data strobe signal DQS with the processor 1100. In some embodiments, each of the data buffers may exchange a signal with the nonvolatile memory module controller 2310. In example embodiments, each of the data buffers may operate according to control of the nonvolatile memory module controller 2310.

Figure 21:
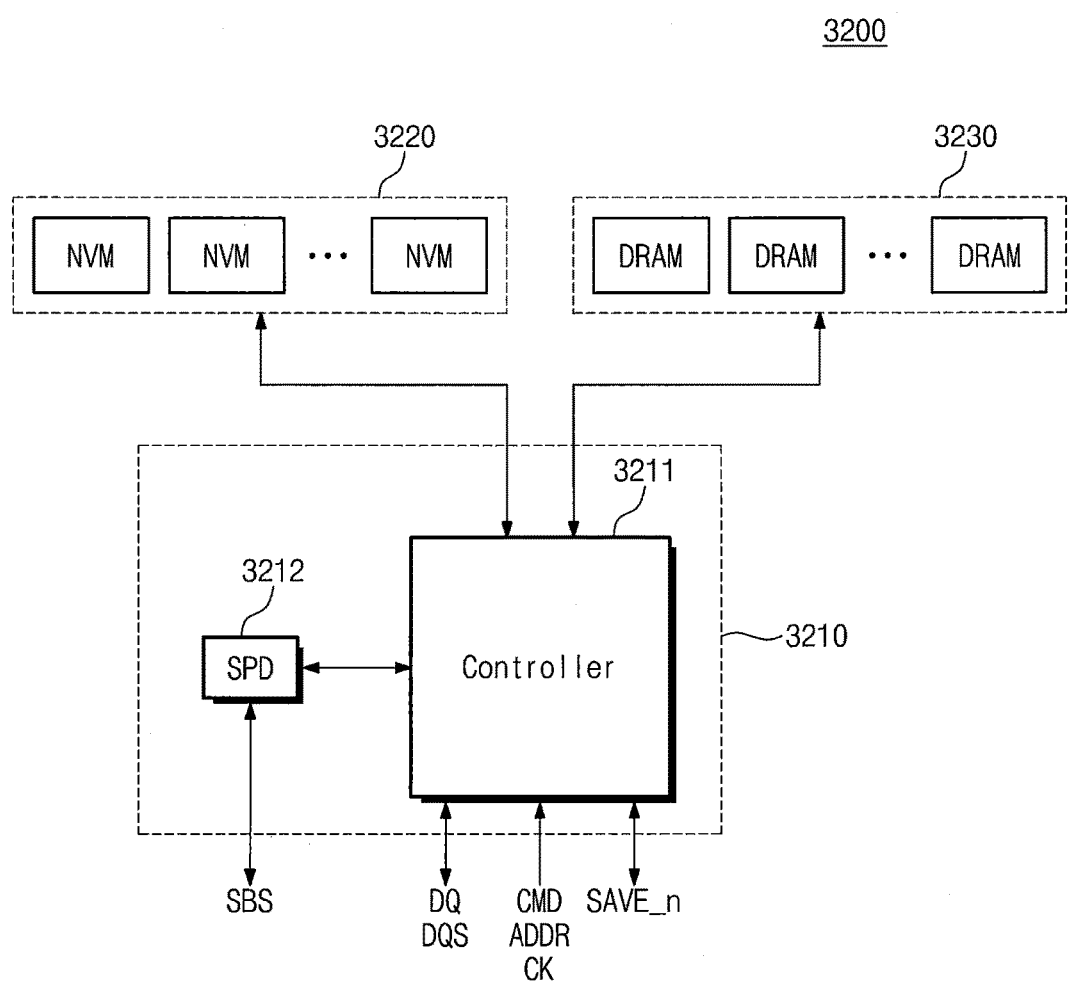
FIG. 21 is a block diagram illustrating one of nonvolatile memory modules of FIG. 18 according to some embodiments of the inventive concept.

FIG. 21 is a block diagram illustrating one of nonvolatile memory modules of FIG. 18 according to some embodiments of the inventive concept. Referring to FIG. 21, a nonvolatile memory module 3200 may include a control circuit 3210, a nonvolatile memory device 3220, and a RAM device 3230. In example embodiments, the nonvolatile memory device 3220 may include a plurality of nonvolatile memories, and the RAM device 3230 may include a plurality of DRAMs. In example embodiments, the nonvolatile memories may be used as storage of the computing system 1000 of FIG. 18 through the processor 1100. In example embodiments, each of the nonvolatile memories may include nonvolatile memory elements such as EEPROM, NAND flash memory, PRAM, resistive RAM (ReRAM), FRAM, STT-MRAM, and the like.

The DRAMs may be used as a main memory of the computing system 1000 of FIG. 18 through the processor 1100. In example embodiments, the RAM device 3230 may include random access memory elements such as DRAM, SRAM, SDRAM, PRAM, ReRAM, FRAM, MRAM, and the like.

The control circuit 3210 may include a nonvolatile memory module controller 3211 and an SPD 3212. The nonvolatile memory module controller 3211 may receive a command CMD, an address ADDR, and a clock CK from the processor 1100. The nonvolatile memory module controller 3211 may selectively store data, received through the data signal DQ and the data strobe signal DQS, in the nonvolatile memory device 3220 or the RAM device 3230 in response to signals received from the processor 1100. In some embodiments, the nonvolatile memory module controller 3211 may selectively transfer data, stored in the nonvolatile memory device 3220 or the RAM device 3230, to the processor 1100 through the data signal DQ and the data strobe signal DQS in response to signals received from the processor 1100.

In example embodiments, the processor 1100 may selectively access the nonvolatile memory device 3220 or the RAM device 3230 through a command CMD, an address ADDR, or a separate signal or separate information. That is, the processor 1100 may selectively access the nonvolatile memory device 3220, included in the nonvolatile memory module 3200, or the RAM device 3230.

Figure 22:
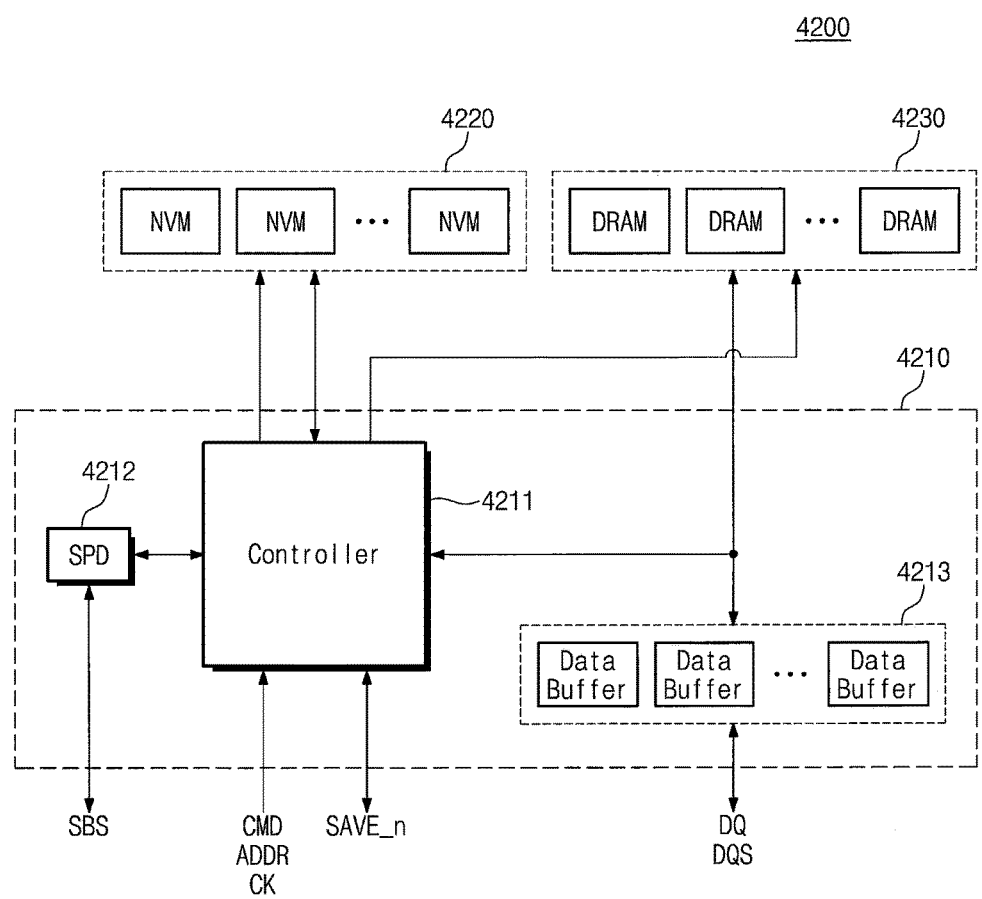
FIG. 22 is a block diagram illustrating one of nonvolatile memory modules of FIG. 18 according to some embodiments of the inventive concept.

FIG. 22 is a block diagram illustrating one of nonvolatile memory modules of FIG. 18 according to some embodiments of the inventive concept. Referring to FIG. 22, a nonvolatile memory module 4200 may include a control circuit 4210, a nonvolatile memory device 4220, and a RAM device 4230. The control circuit 4210 may include a nonvolatile memory module controller 4211, an SPD 4212, and a data buffer circuit 4213.

The nonvolatile memory module controller 4211 may receive a command CMD, an address ADDR, and a clock CK from the processor 1100 in FIG. 18. The nonvolatile memory module controller 4211 may control the nonvolatile memory device 4220 or the RAM device 4230 in response to received signals. For example, the processor 1100 may selectively access the nonvolatile memory device 4220 or the RAM device 4230. The nonvolatile memory module controller 4211 may control the nonvolatile memory device 4220 or the RAM device 4230 in response to control of the processor 4100.

A data buffer circuit 4213 may receive the data signal DQ and the data strobe signal DQS from the processor 1100 and may provide the received signals to the nonvolatile memory module controller 4211 and the RAM device 4230. In some embodiments, the data buffer circuit 4213 may provide data, received from the nonvolatile memory module controller 4211 or the RAM device 4230, to the processor 1100 through the data signal DQ and the data strobe signal DQS.

In example embodiments, in the case where the processor 1100 stores data in the nonvolatile memory device 4220, data received through the data signal DQ and the data strobe signal DQS may be provided to the nonvolatile memory module controller 4211, and the nonvolatile memory module controller 4211 may process the received data and may provide the processed data to the nonvolatile memory device 4220. In some embodiments, in the case where the processor 1100 reads data stored in the nonvolatile memory device 4220, the data buffer circuit 4213 may provide data provided from the nonvolatile memory module controller 4211 to the processor 1100 through the data signal DQ and the data strobe signal DQS. In the case where the processor 1100 stores data in the RAM device 4230, data provided to the data buffer circuit 4213 may be provided to the RAM device 4230, and the nonvolatile memory module controller 4211 may transfer received command CMD, addresses ADDR, and clock CK to the RAM device 4230. When the processor 1100 reads data stored in the RAM device 4230, the nonvolatile memory module controller 4211 may transfer the received command CMD, addresses ADDR, and clock CK to the RAM device 4230, and the RAM device 4230 may provide data to the data buffer circuit 4213 in response to the transferred signals. At this time, the data buffer circuit 4213 may provide data to the processor 1100 through the data signal DQ and the data strobe signal DQS.

Figure 23:
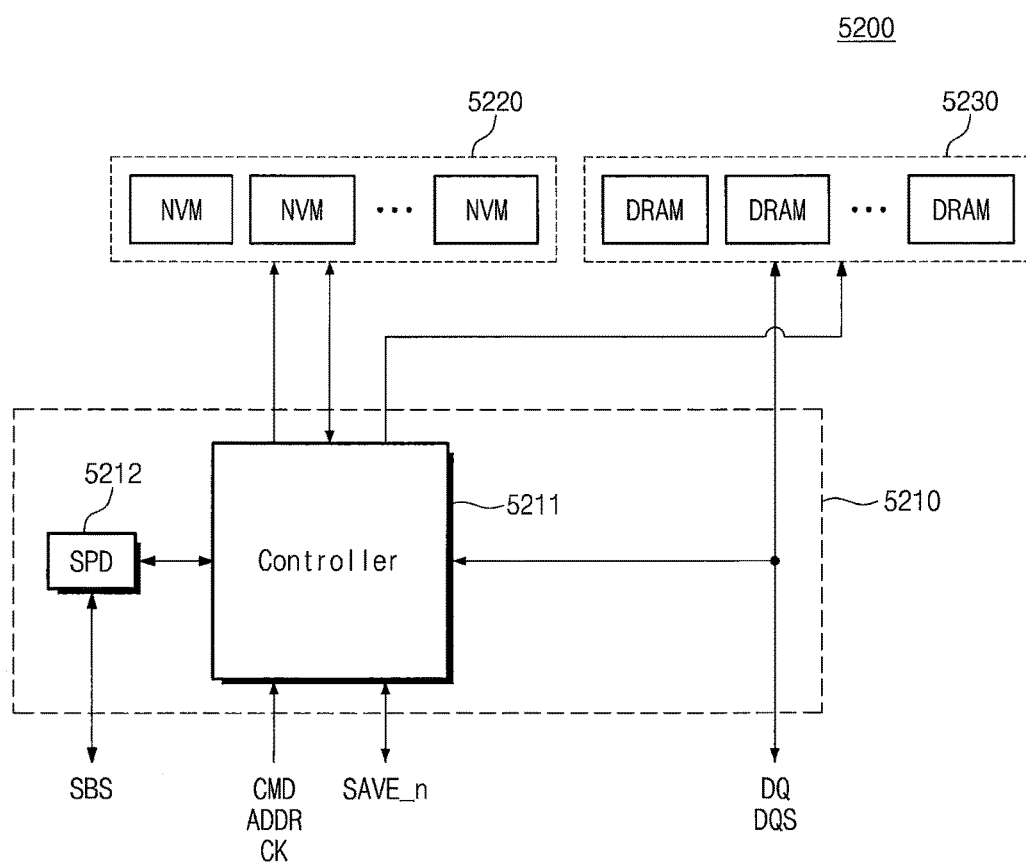
FIG. 23 is a block diagram illustrating one of nonvolatile memory modules of FIG. 18 according to some embodiments of the inventive concept.

FIG. 23 is a block diagram illustrating one of nonvolatile memory modules of FIG. 18 according to some embodiments of the inventive concept. Referring to FIG. 23, a nonvolatile memory module 5200 may include a control circuit 5210, a nonvolatile memory device 5220, and a RAM device 5230. The control circuit 5210 may include a nonvolatile memory module controller 5211 and an SPD 5212. The nonvolatile memory module 5200 may operate to be similar to the nonvolatile memory module 4200 of FIG. 22. However, the nonvolatile memory module 5200 may not include the data buffer circuit 4213 of the nonvolatile memory module 4200 in FIG. 22. That is, the nonvolatile memory module 5200 of FIG. 23 may directly provide data, received from the processor 1100 through the data signal DQ and the data strobe signal DQS, to the nonvolatile memory module controller 5211 or the RAM device 5230. In some embodiments, data from the nonvolatile memory module controller 5211 of the nonvolatile memory module 5200 or data from the RAM device 5230 may be directly provided to the processor 1100 through the data signal DQ and the data strobe signal DQS.

In example embodiments, the nonvolatile memory module 4200 of FIG. 22 may be a memory module of an LRDIMM shape, and the nonvolatile memory module 5200 of FIG. 23 may be a memory module of an RDIMM shape.

Figure 24:
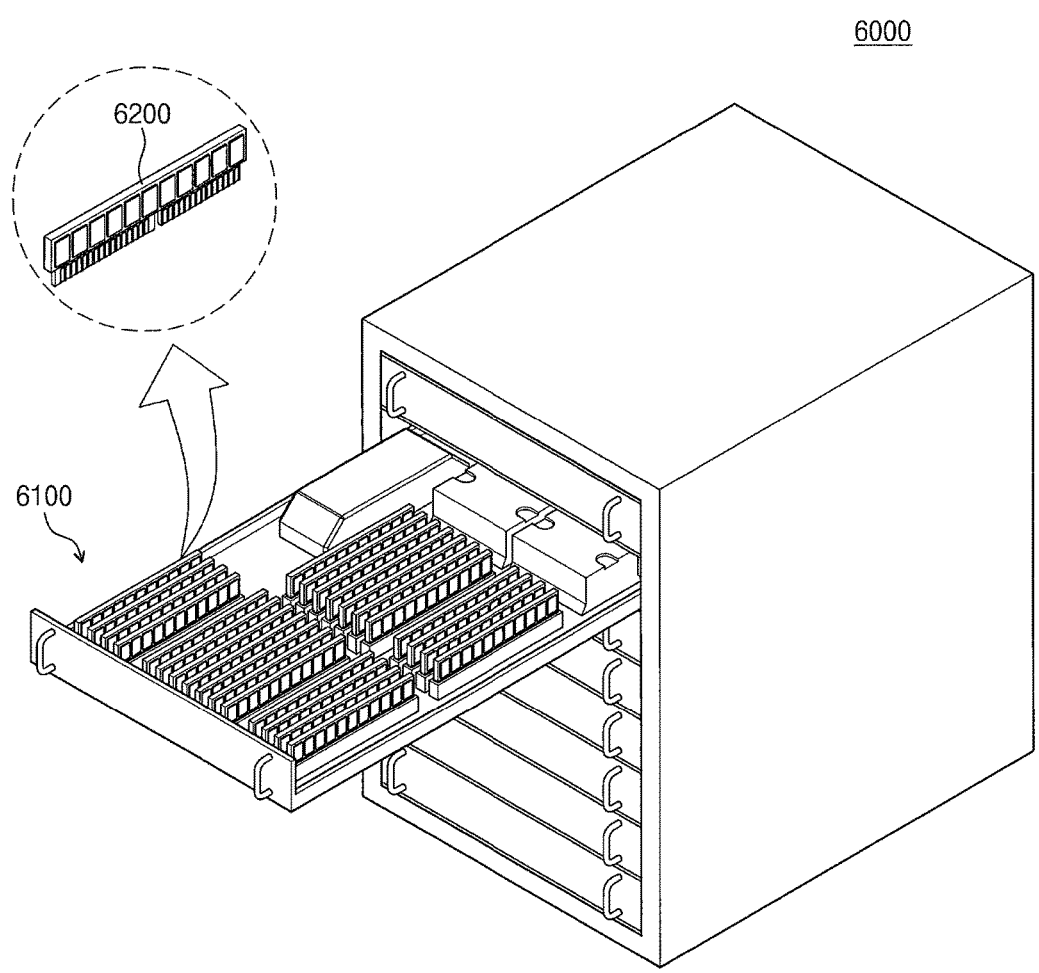
FIG. 24 is a diagram illustrating a server system to which a nonvolatile memory system according to some embodiments of the inventive concept is applied.

FIG. 24 is a diagram illustrating a server system to which a nonvolatile memory system according to some embodiments of the inventive concept is applied. Referring to FIG. 24, a server system 6000 may include a plurality of server racks 6100. Each of the server racks 6100 may include a plurality of nonvolatile memory modules 6200. The nonvolatile memory modules 6200 may be directly connected with processors respectively included in the server racks 6100. For example, the nonvolatile memory modules 6200 may have the form of a dual in-line memory module and may be mounted on a DIMM socket electrically connected with a processor so as to communicate with the processor. In example embodiments, the nonvolatile memory modules 6200 may be used as storage of the server system 6000.

A nonvolatile memory and/or a nonvolatile memory module controller according to the inventive concept may be packaged according to any of a variety of different packaging technologies. Examples of such packaging technologies may include package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), small outline (SOIC), shrink small outline package (SSOP), thin small outline (TSOP), thin quad flatpack (TQFP), system in package (SIP), multi-chip package (MCP), wafer-level fabricated package (WFP), and wafer-level processed stack package (WSP).

According to some embodiments of the inventive concept, an electronic device (e.g., computing system) and a memory management method thereof may allocate page data of a DRAM as a read only mode and page data of a nonvolatile memory as a read/write mode, thereby improving the whole performance of system.

While the inventive concept has been described with reference to example embodiments, it will be apparent to those skilled in the art that various changes and modifications may be made without departing from the spirit and scope of the inventive concept. The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A memory management method of a computing system, the method comprising:
    setting page data of a nonvolatile memory as a read/write mode;
    copying the page data of the nonvolatile memory to a dynamic random access memory (DRAM); and
    setting the page data of the DRAM copied from the nonvolatile memory as a read only mode; performing a write operation on the DRAM in response to a write request; failing, by the DRAM, the write operation based on the setting the page data of the DRAM copied from the nonvolatile memory as the read only mode; receiving write failure information from the DRAM; and writing data in the nonvolatile memory in response to the write failure information, wherein the computing system comprises:
    a processor, the processor being configured to set the page data of the nonvolatile memory as the read/write mode, configured to copy the page data of the nonvolatile memory to the DRAM and configured to set the page data of the DRAM copied from the nonvolatile memory as the read only mode;
    a memory module that is connected to the processor with a double data rate (DDR) interface and comprises the DRAM; and
    a nonvolatile memory module that is connected to the processor with the DDR interface and comprises the nonvolatile memory.

2. The method of claim 1, wherein the copying of the page data of the nonvolatile memory comprises:
    receiving a memory allocation request from a first application of the processor; and
    copying the page data of the nonvolatile memory to the DRAM in response to the memory allocation request.

3. The method of claim 1, further comprising:
    receiving the write request from a third application of the processor.

4. The method of claim 3, wherein the writing of the data in the nonvolatile memory comprises:
    setting an address of a static random access memory (SRAM) included in the nonvolatile memory;
    writing the data in the SRAM; and
    setting the data in the SRAM as the read/write mode.

5. The method of claim 1, where the page data of the DRAM is one among a plurality of page data stored in the DRAM, and
    wherein the method further comprises:
    receiving an update request about at least one of the plurality of page data stored in the DRAM from a fourth application of the processor; and
    writing data that will be updated in the at least one of the plurality of page data in the DRAM to at least one page data in the nonvolatile memory in response to the update request.

6. The method of claim 1, wherein setting the page data of the DRAM copied from the nonvolatile memory as a read only mode comprises configuring the DRAM to issue a memory write access fault in response to the write request.

7. The method of claim 1, wherein setting the page data of the DRAM copied from the nonvolatile memory as a read only mode comprises setting the page data of the DRAM copied from the nonvolatile memory as the read only mode while the page data of the nonvolatile memory is in the read/write mode.

8. A memory management method of a computing system which comprises a processor, a memory module, and a nonvolatile memory module, the method comprising:
    receiving a memory allocation request from an application;
    copying application data stored in the nonvolatile memory module to the memory module in response to the memory allocation request;
    setting the application data of the memory module copied from the nonvolatile memory module as a read only mode;
    receiving a write request from the application;
    performing a write operation on the memory module in response to the write request;
    failing, by the memory module, the write operation based on the setting the application data of the memory module copied from the nonvolatile memory module as the read only mode; and
    performing the write operation on a static random access memory (SRAM) of the nonvolatile memory module after the write operation on the memory module fails.

9. The method of claim 8, further comprising:
    setting the application data stored in the nonvolatile memory module as a read/write mode.

10. The method of claim 8, further comprising:
    receiving a write request from the application;
    determining that the application data of the memory module copied from the nonvolatile memory module is set as the read only mode; and
    performing the write operation on the nonvolatile memory module based on the determining that the application data of the memory module copied from the nonvolatile memory module is set as the read only mode.

11. A memory management method of an electronic device comprising:
    reading first application data from a memory module in response to a read request from a first application of a processor, the memory module being connected to the processor with an interface and being set as a read only mode; and
    writing second application data to a nonvolatile memory module in response to a write request from a second application of the processor, the nonvolatile memory module being connected to the processor with the interface and being set as a read/write mode, wherein writing the second application data to the nonvolatile memory module comprises:
    performing a write operation on the memory module;
    failing, by the memory module, the write operation based on the memory module being set as the read only mode; and
    performing the write operation on the nonvolatile memory module after the write operation on the memory module fails.

12. The method of claim 11, further comprising:
    receiving a memory allocation request from a third application of the processor;

copying third application data stored in the nonvolatile memory module to the memory module in response to the memory allocation request; and setting the third application data in the memory module as a read only mode.

13. The method of claim 11, wherein the memory module being set as a read only mode and the nonvolatile memory module being set as a read/write mode comprises setting the memory module and the nonvolatile memory module such that the memory module is in the read only mode simultaneously with the nonvolatile memory module being in the read/write mode.

14. The method of claim 1, further comprising:

when a number of pieces of page data stored in the nonvolatile memory exceeds a reference value, copying at least one of the pieces of page data stored in the nonvolatile memory to the DRAM in a background operation.

* * * * *